(12) United States Patent
Seo et al.

(10) Patent No.: US 12,530,920 B2
(45) Date of Patent: Jan. 20, 2026

(54) FINGERPRINT SENSOR PACKAGE AND DEVICE INCLUDING THE SAME

(71) Applicant: Samsung Electronics Co., Ltd., Suwon-si (KR)

(72) Inventors: Hojin Seo, Suwon-si (KR); Hyunggil Baek, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/771,182

(22) Filed: Jul. 12, 2024

(65) Prior Publication Data

US 2025/0166407 A1 May 22, 2025

(30) Foreign Application Priority Data

Nov. 21, 2023 (KR) ........................ 10-2023-0161963

(51) Int. Cl.
*G06V 40/13* (2022.01)

(52) U.S. Cl.
CPC ...... *G06V 40/1306* (2022.01); *G06V 40/1329* (2022.01)

(58) Field of Classification Search
None
See application file for complete search history.

(56) References Cited

U.S. PATENT DOCUMENTS

| | | | |
|---|---|---|---|
| 7,723,159 | B2 | 5/2010 | Do et al. |
| 9,024,403 | B2 | 5/2015 | Park et al. |
| 11,538,268 | B2 | 12/2022 | Lim et al. |
| 2017/0249493 | A1* | 8/2017 | Yu ........................... H01L 25/16 |
| 2017/0261459 | A1* | 9/2017 | Meyer .................. G01N 27/226 |
| 2017/0364726 | A1* | 12/2017 | Buchan .............. G01N 29/2437 |

FOREIGN PATENT DOCUMENTS

| | | |
|---|---|---|
| KR | 10-2195672 B1 | 12/2020 |
| KR | 10-2021-0046249 A | 4/2021 |
| KR | 10-2021-0088975 A | 7/2021 |
| KR | 10-2325225 B1 | 11/2021 |
| KR | 10-2341840 B1 | 12/2021 |

* cited by examiner

*Primary Examiner* — Joseph R Haley
(74) *Attorney, Agent, or Firm* — Harness, Dickey & Pierce, P.L.C.

(57) ABSTRACT

A fingerprint sensor package includes a substrate including a plurality of first sensing patterns spaced apart from each other in a first direction and extending in a second direction intersecting the first direction, and a plurality of second sensing patterns spaced apart from each other in the second direction and extending in the first direction; a film substrate defining a through-hole region penetrating the film substrate, the through-hole region overlapping a portion of the substrate in a vertical direction; a controller chip in the through-hole region, the controller chip being electrically connected to the substrate; a plurality of first bonding pads on an upper surface of the film substrate; a plurality of second bonding pads on a lower surface of the substrate; and a plurality of bumps electrically connected between the plurality of first bonding pads and the plurality of second bonding pads.

18 Claims, 20 Drawing Sheets

FINGERPRINT SENSOR PACKAGE AND DEVICE INCLUDING THE SAME

CROSS-REFERENCE TO RELATED APPLICATION(S)

This application claims the benefit under 35 USC 119(a) of Korean Patent Application No. 10-2023-0161963 filed on Nov. 21, 2023 in the Korean Intellectual Property Office, the entire disclosure of which is incorporated herein by reference for all purposes.

BACKGROUND

The inventive concepts relate to fingerprint sensor packages and devices including the same.

Fingerprint recognition technology is used to limit and/or prevent various security incidents by recognizing the user's fingerprint and going through the registration and authentication process, and in detail, is applied to individual and organizational network defense, protection of various contents and data, safe access to financial information, and the like. The fingerprint sensor acquires a user's fingerprint information using optical, capacitive, ultrasonic, or thermal detection methods. The recent trend in the fingerprint sensor industry has been to continuously miniaturize and thin products while achieving lower costs. Accordingly, fingerprint sensor packages are required to improve the reliability and sensitivity of acquiring fingerprint information, reduce the overall size and height, and at the same time satisfy economic feasibility.

SUMMARY

Example embodiments of the inventive concepts provide a fingerprint sensor package advantageous in reducing an overall size (horizontal area and/or vertical thickness) while improving durability and/or reliability, and a device including the same.

Some example embodiments of the inventive concepts provide a fingerprint sensor package that includes a substrate including a plurality of first sensing patterns spaced apart from each other in a first direction and extending in a second direction intersecting the first direction, and a plurality of second sensing patterns spaced apart from each other in the second direction and extending in the first direction; a film substrate defining a through-hole region penetrating the film substrate, the through-hole region overlapping a portion of the substrate in a vertical direction; a controller chip in the through-hole region, the controller chip being electrically connected to the substrate; a plurality of first bonding pads on an upper surface of the film substrate; a plurality of second bonding pads on a lower surface of the substrate; and a plurality of bumps electrically connected between the plurality of first bonding pads and the plurality of second bonding pads.

Some example embodiments of the inventive concepts further provide a fingerprint sensor package that includes a substrate including a plurality of first sensing patterns spaced apart from each other in a first direction and extending in a second direction intersecting the first direction, and a plurality of second sensing patterns spaced apart from each other in the second direction and extending in the first direction; a film substrate defining a through-hole region penetrating the film substrate, the through-hole region overlapping a portion of the substrate in a vertical direction; a controller chip in the through-hole region, the controller chip being electrically connected to the substrate; and a plurality of external connection pads on a lower surface of the film substrate. A height from the lower surface of the film substrate to a lower surface of the substrate is greater than a height from a lower surface of the controller chip to the lower surface of the substrate.

Some example embodiments of the inventive concepts still further provide a device that includes a device body defining a recessed region in the device body; a device substrate on the device body; a device chip electrically connected to the device substrate; a plurality of terminals in the recessed region, the plurality of terminals being electrically connected to the device substrate; and a fingerprint sensor package in the recessed region, the fingerprint sensor package being electrically connected to the plurality of terminals. The fingerprint sensor package includes a substrate including a plurality of first sensing patterns spaced apart from each other in a first direction and extending in a second direction intersecting the first direction, and a plurality of second sensing patterns spaced apart from each other in the second direction and extending in the first direction; a film substrate defining a through-hole region penetrating the film substrate, the through-hole region overlapping a portion of the substrate in a vertical direction; a controller chip in the through-hole region, the controller chip being electrically connected to the substrate; a plurality of first bonding pads on an upper surface of the film substrate; a plurality of second bonding pads on a lower surface of the substrate; and a plurality of bumps electrically connecting the substrate and the film substrate.

BRIEF DESCRIPTION OF DRAWINGS

The above and other aspects, features, and advantages of the inventive concepts will be more clearly understood from the following detailed description, taken in conjunction with the accompanying drawings, in which.

DETAILED DESCRIPTION

Figure 1A:
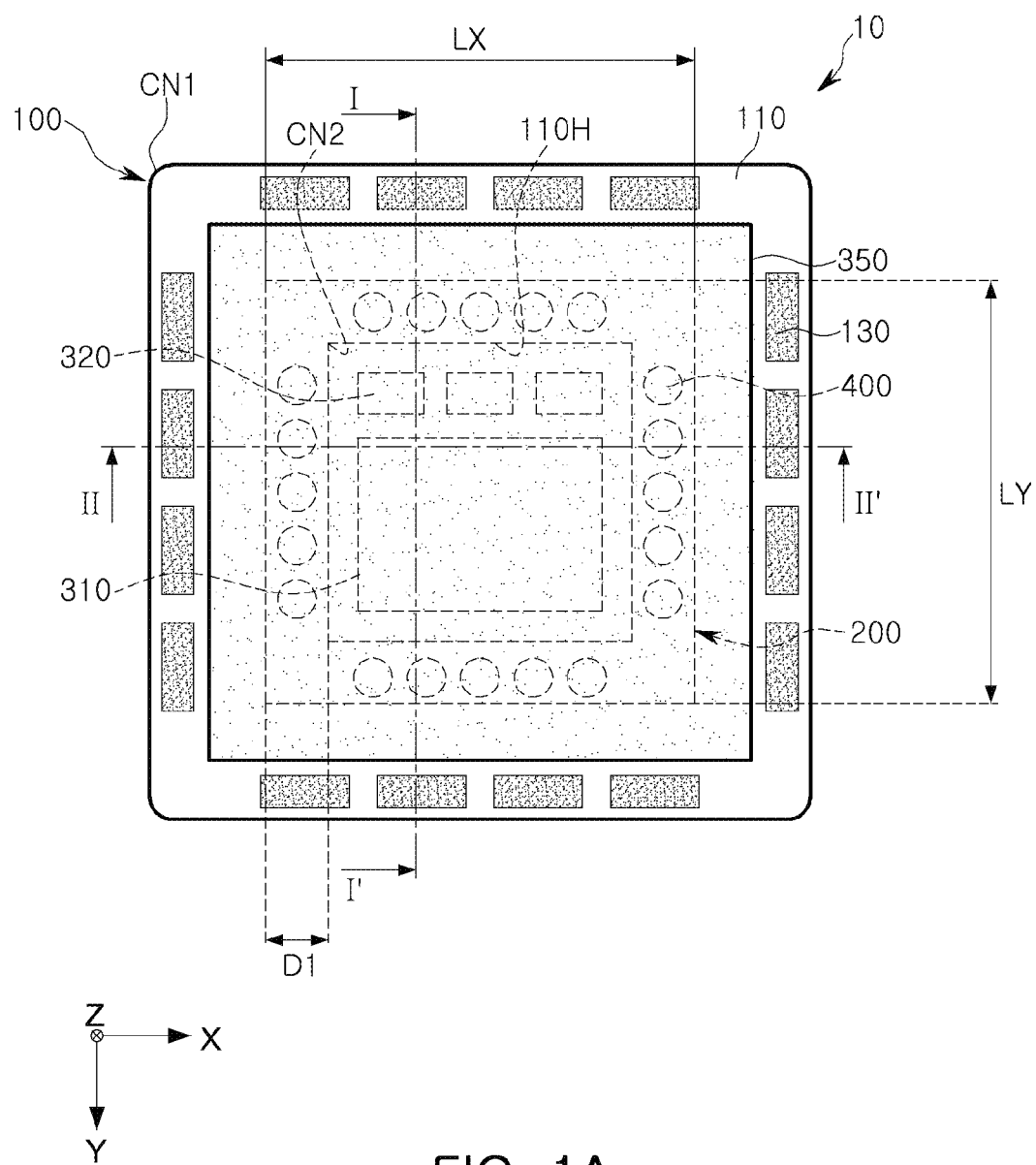
FIG. 1A is a bottom view schematically illustrating the layout of a fingerprint sensor package 10 according to some example embodiments of the inventive concepts.

The detailed description of the inventive concepts described below refers to the accompanying drawings, which illustrate, by way of example, some example embodiments in which the inventive concepts may be practiced. These example embodiments are described in sufficient detail to enable those skilled in the art to practice the inventive concepts. It should be understood that the various example embodiments are different from one another but are not necessarily mutually exclusive. For example, specific shapes, structures and characteristics described herein with respect to some example embodiments may be implemented in other example embodiments without departing from the spirit and scope of the inventive concepts. It should be understood that the location or arrangement of individual components within each disclosed example embodiment may be changed without departing from the spirit and scope of the inventive concepts. Accordingly, the detailed description below is not intended to be taken in a limiting sense, and the scope of the inventive concepts is limited only by the appended claims, together with all equivalents asserted in those claims. Similar reference numbers in the drawings refer to identical or similar functions across various aspects.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Also, for example, "at least one of A, B, and C" and similar language (e.g., "at least one selected from the group consisting of A, B, and C") may be construed as A only, B only, C only, or any combination of two or more of A, B, and C, such as, for instance, ABC, AB, BC, and AC.

Below, in order to enable those skilled in the art to easily practice the inventive concepts, some example embodiments will be described in detail with reference to the attached drawings.

Figure 1B:
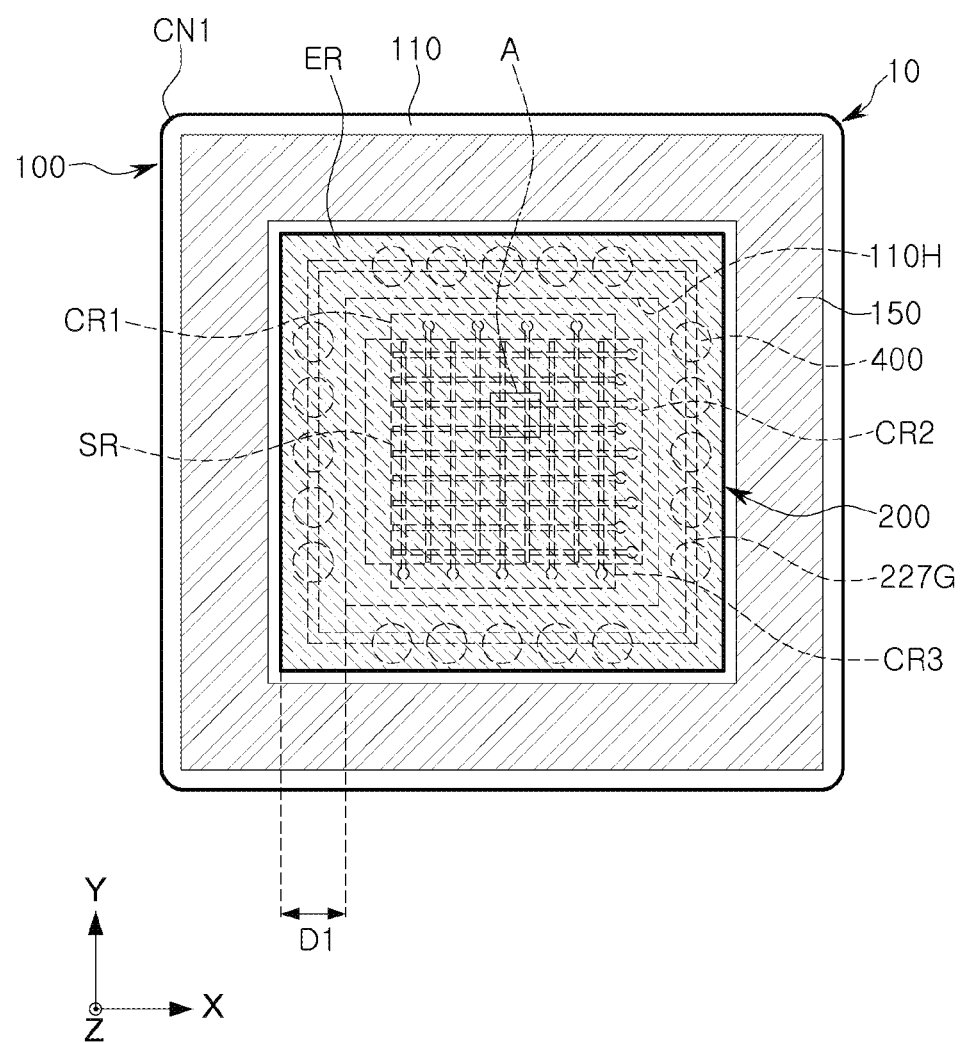
FIG. 1B is a plan view illustrating the fingerprint sensor package 10 of FIG. 1A.
Figure 1C:
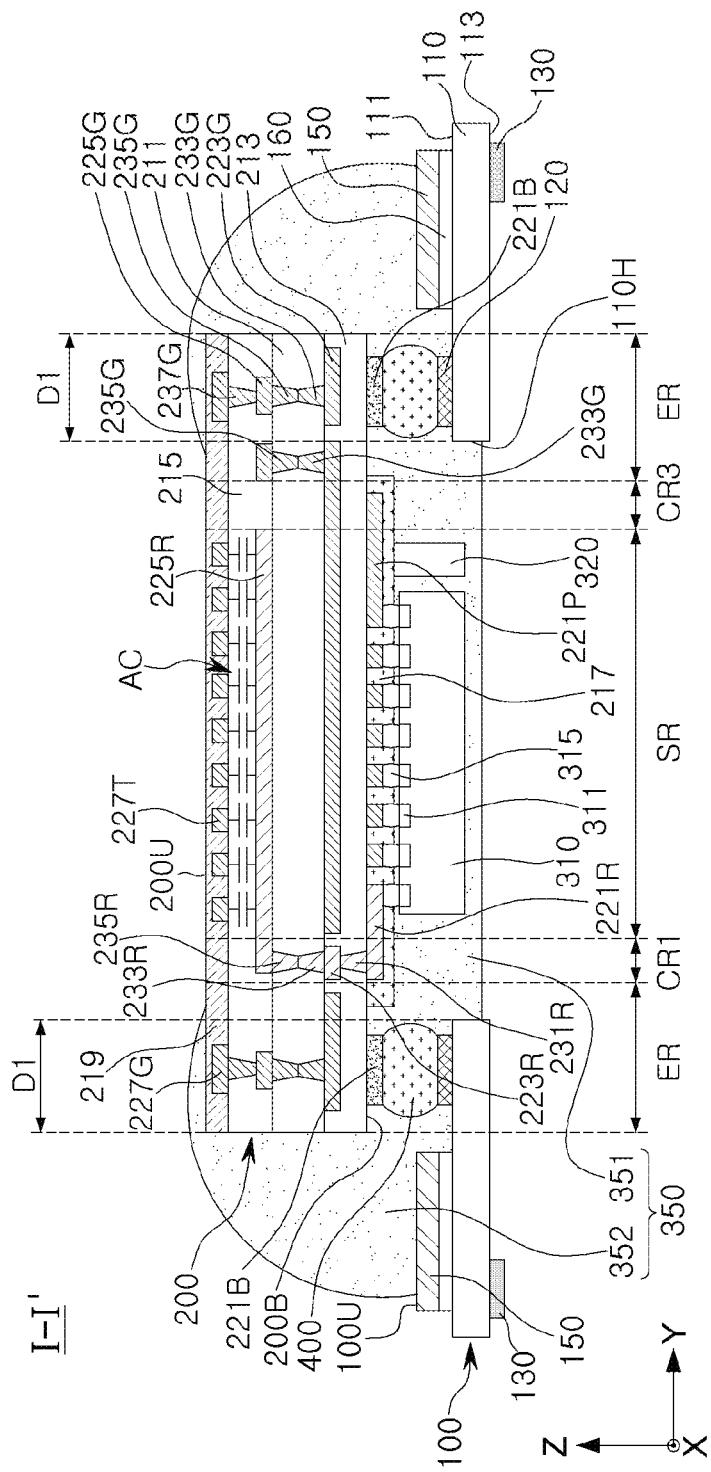
FIG. 1C is a cross-sectional view taken along line I-I' of FIG. 1A.
Figure 1D:
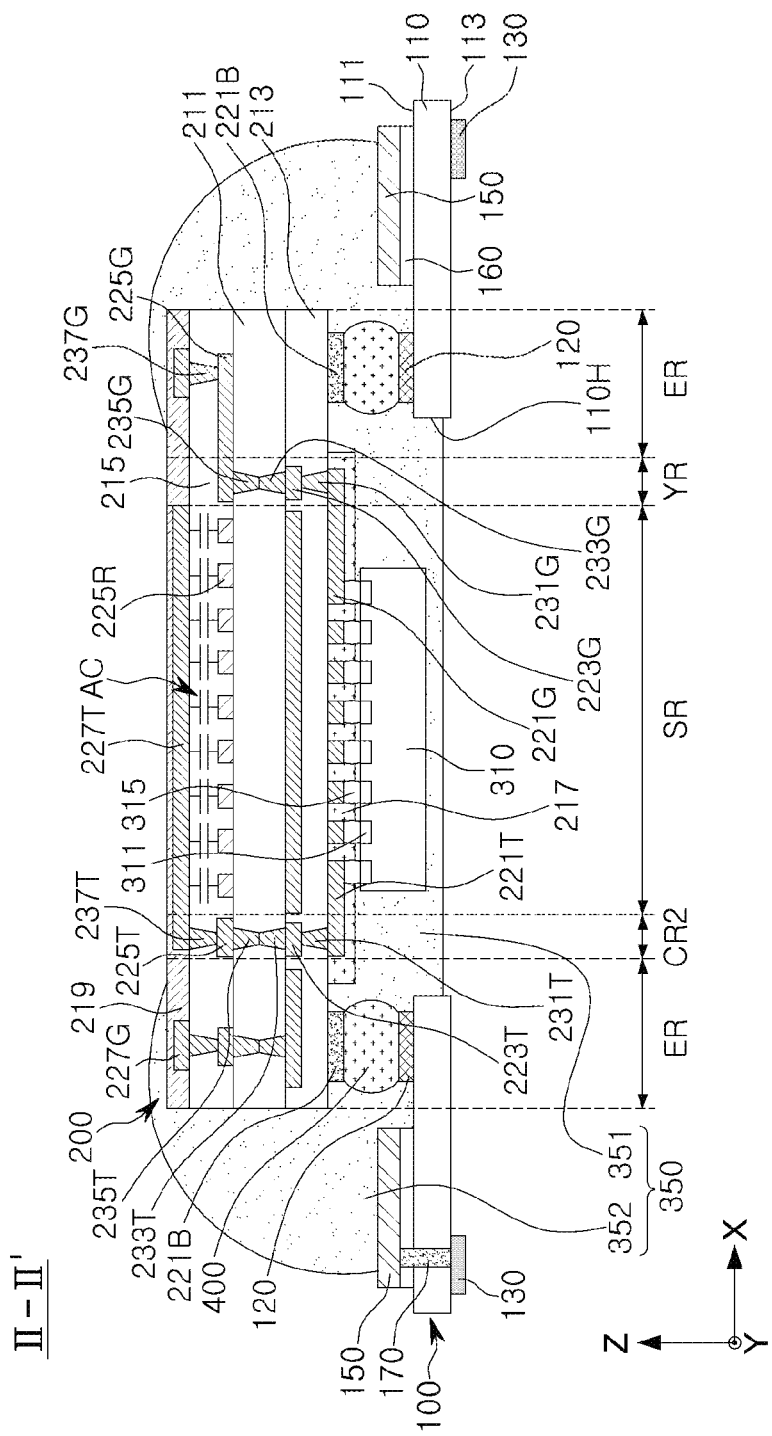
FIG. 1D is a cross-sectional view taken along line II-II' of FIG. 1A.
Figure 1E:
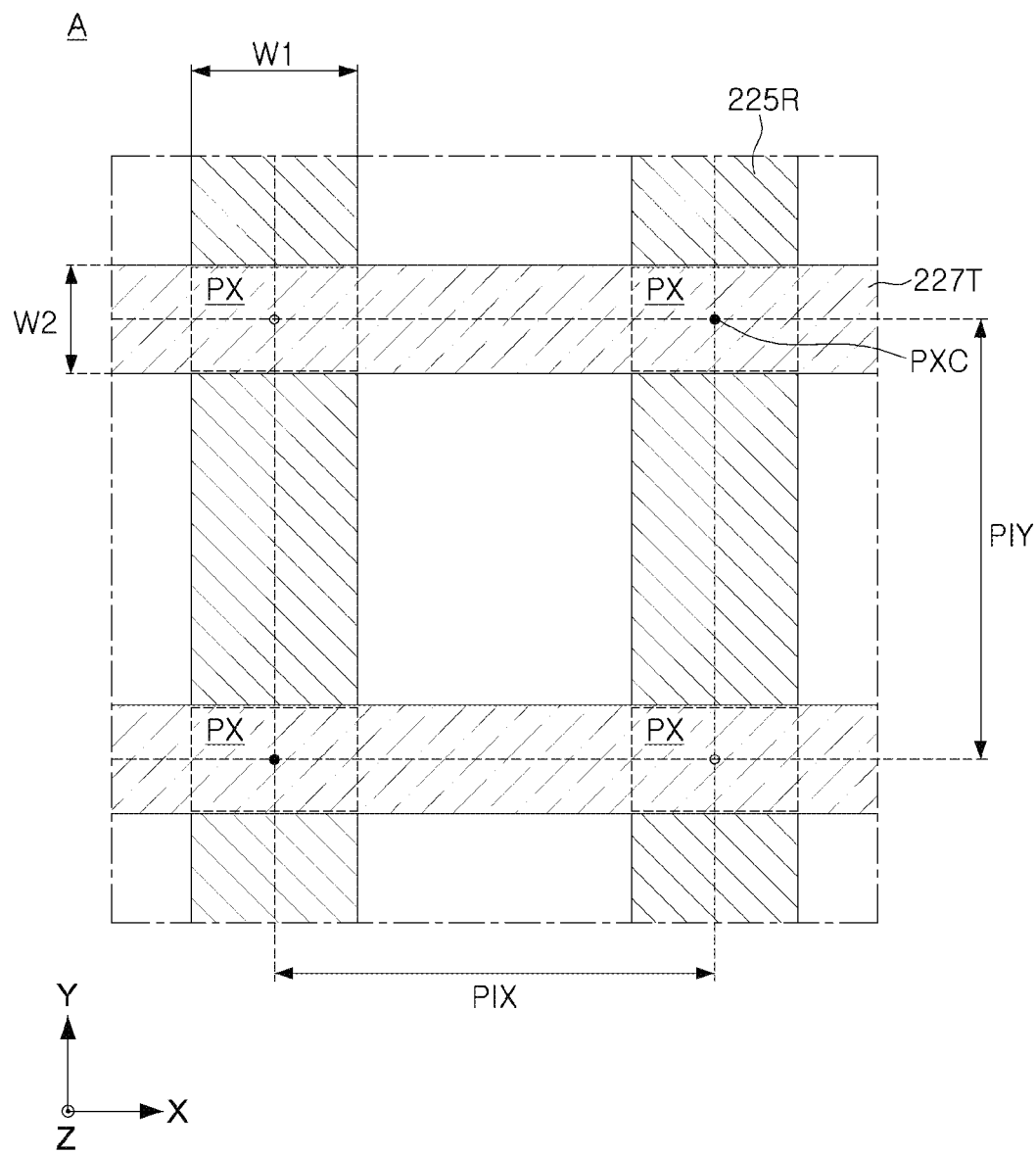
FIG. 1E is an enlarged view illustrating the area indicated by "A" in FIG. 1B.

FIG. 1A is a bottom view schematically illustrating the layout of a fingerprint sensor package 10, FIG. 1B is a plan view illustrating the fingerprint sensor package 10 of FIG. 1A, FIG. 1C is a cross-sectional view taken along line I-I' of FIG. 1A, FIG. 1D is a cross-sectional view taken along line II-II' of FIG. 1A, and FIG. 1E is an enlarged view illustrating the area indicated by "A" in FIG. 1B.

Referring to FIGS. 1A to 1E, the fingerprint sensor package 10 according to an some example embodiments may include a substrate 200, a film substrate 100, a controller chip 310, and a plurality of bumps 400. Referring to FIGS. 1B to 1D, the substrate 200 may include a sensing region SR, a first contact region CR1, a second contact region CR2, a third contact region CR3, a wiring region YR, and a peripheral region ER. Referring to FIGS. 1C and 1D, the substrate 200 may include a base layer 211, a lower insulating layer 213 on the lower surface of the base layer 211, an upper insulating layer 215 on the upper surface of the base layer 211, a lower protective layer 217 on the lower surface of the lower insulating layer 213, and an upper protective layer 219 on the upper surface of the upper insulating layer 215.

The substrate 200 may have a substantially rectangular planar shape or a square planar shape. The substrate 200 may include an upper surface 200U and a lower surface 200B that are opposed to each other, the upper surface 200U of the substrate 200 is a surface contacted for fingerprint recognition, and the lower surface 200B of the substrate 200 may be a surface on which components such as the controller chip 310 are mounted. A first length LX of the substrate 200 in the first direction (X-direction) may range from about 10 mm to about 15 mm. A second length LY of the substrate 200 in the second direction (Y-direction) may range from about 10 mm to about 15 mm. For example, the first length LX of the substrate 200 may be about 12.7 mm, and the second length LY may be about 12.7 mm.

The substrate 200 may include a PCB. In some example embodiments, the substrate 200 may include a rigid type substrate. The substrate 200 may be a multi-layer PCB including a plurality of conductive layers. The substrate 200 may include conductive layers located at different vertical levels and conductive vias for electrically connecting the conductive layers. The conductive layers and conductive vias may include at least one selected from copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), and alloys thereof.

For example, the substrate 200 may include first conductive layers 221B, 221G, 221R, 221T and 221P, second conductive layers 223G, 223R and 223T, third conductive layers 225G, 225R and 225T, and fourth conductive layers 227G and 227T in order of increasing distance from the upper surface 200U. The first conductive layers 221B, 221G, 221R, 221T and 221P are on the lower surface of the lower insulating layer 213, the second conductive layers 223G, 223R, 223T are on the lower surface of the base layer 211, the third conductive layers 225G, 225R, 225T are on the upper surface of the base layer 211, and the fourth conductive layers 227G and 227T may be on the upper surface of the upper insulating layer 215.

The first conductive layers 221B, 221G, 221R, 221T and 221P may include second bonding pads 221B, 1-1 sensing pads 221R, 1-2 sensing pads 221T, a first ground pattern 221G, and a power pattern 221P. The second conductive layers 223G, 223R, and 223T may include 2-1 sensing pads 223R, 2-2 sensing pads 223T, and a second ground pattern 223G. The third conductive layers 225G, 225R, and 225T may include first sensing patterns 225R, 3-2 sensing pads 225T, and a third ground pattern 223G. The fourth conductive layers 227G and 227T may include second sensing patterns 227T and a fourth ground pattern 227G.

The conductive vias 231R, 233R, and 235R are spaced apart from the ground pattern 223G and may electrically connect the plurality of first sensing patterns 225R and the plurality of second sensing patterns 227T to the controller chip 310. The ground pattern 223G is disposed between the lower insulating layer 213 and the base layer 211 and may overlap the controller chip 310 vertically. Accordingly, the ground pattern 223G may increase the electromagnetic isolation between the first and second sensing patterns 225R and 227T and the controller chip 310, and may reduce noise in signals of the first and second sensing patterns 225R and 227T.

The substrate 200 may include first conductive vias 231G, 231R and 231T for electrically connecting the first conductive layers 221B, 221G, 221R, 221T and 221P and the second conductive layers 223G, 223R and 223T, second conductive vias 233G, 233R and 233T and third conductive vias 235G for electrically connecting the second conductive layers 223G, 223R and 223T and the third conductive layers 225G, 225R, 225T, 235R and 235T, and fourth conductive vias 237T and 237G for electrically connecting the third conductive layers 225G, 225R and 225T and the fourth conductive layers 227G and 227T. The first conductive vias 231G, 231R, and 231T may at least partially penetrate through the lower insulating layer 213, the second conductive vias 233G, 233R, and 233T may partially penetrate through the base layer 211, the third conductive vias 235G, 235R, and 235T may partially penetrate through the base layer 211, and the fourth conductive vias 237T and 237G may at least partially penetrate through the upper insulating layer 215.

The first conductive vias 231G, 231R and 231T may include 1-1 sensing vias 231R for electrical connection between the 1-1 sensing pads 221R and the 2-1 sensing pads 223R, 1-2 sensing vias 231T for electrically connecting the 1-2 sensing pads 221T and the 2-2 sensing pads 223T, and a first ground via 231G for electrical connection between the first ground pattern 221G and the second ground pattern 223G. In some example embodiments, the first conductive vias 231G, 231R, and 231T may have a tapered structure in which the horizontal width decreases toward the base layer 211.

The second conductive vias 233G, 233R, and 233T may include 2-1 sensing vias 233R for electrically connecting the 2-1 sensing pads 223R and the first sensing patterns 225R, 2-2 sensing vias 233T for electrically connecting the 2-2 sensing pads 223T and the 3-2 sensing pads 225T, and a second ground via 233G for electrically connecting the second ground pattern 223G and the third ground pattern 223G. The third conductive vias 235G, 235R and 235T may include 3-1 sensing vias 235R for electrically connecting the 2-1 sensing pads 223R and the first sensing patterns 225R, 3-2 sensing vias 235T for electrically connecting the 2-2 sensing pads 223T and the 3-2 sensing pads 225T, and a third ground via 235G for electrical connection between the second ground pattern 223G and the third ground pattern 223G.

The second conductive vias 233G, 233R and 233T may contact the second conductive layers 223G, 223R and 223T, the third conductive vias 235G, 235R and 235T may contact the third conductive layers 225G, 225R and 225T, and the second conductive vias 233G, 233R, and 233T and the third conductive vias 235G, 235R, and 235T may contact each other. For example, the 2-1 sensing pads 223R and the first sensing patterns 225R may be electrically connected by the vertically connected 2-1 sensing vias 233R and 3-1 sensing vias 235R, the 2-2 sensing pads 223T and the 3-2 sensing pads 225T may be electrically connected by the vertically connected 2-2 sensing vias 233T and 3-2 sensing vias 235T, and the second ground pattern 223G and the third ground pattern 223G may be electrically connected by the vertically connected second ground via 233G and third ground via 235G.

In some example embodiments, the second conductive vias 233G, 233R, 233T and the third conductive vias 235G, 235R and 235T may respectively have a tapered structure in which the horizontal width decreases toward the center along the thickness direction of the base layer 211. In some example embodiments, the second conductive vias 233G, 233R, 233T and the third conductive vias 235G, 235R and 235T may have a minimum horizontal width at the contact surface therebetween.

The fourth conductive vias 237T and 237G may include a 4-2 sensing via 237T for electrically connecting the 3-2 sensing pads 225T and the second sensing patterns 227T, and a fourth ground via 237G for electrical connection between the third ground pattern 223G and the fourth ground pattern 227G. In some example embodiments, the fourth conductive vias 237T and 237G may have a tapered structure in which the horizontal width decreases toward the base layer 211.

The substrate 200 may include a sensing region SR, a first contact region CR1, a second contact region CR2, a third contact region CR3, a wiring region YR, and a peripheral region ER. For example, the sensing region SR may be an area in which the first and second sensing patterns 225R and 227T for fingerprint recognition are disposed. Referring to FIG. 1C, the first contact region CR1 and the third contact region CR3 may be regions in which 1-1 sensing vias 231R, 2-1 sensing vias 233R, and 3-1 sensing vias 235R for connecting the first sensing patterns 225R and the controller chip 310 are disposed. Referring to FIG. 1D, the second contact region CR2 may be a region in which 1-2 sensing vias 231T, 2-2 sensing vias 233T, 3-2 sensing vias 235T, and 4-2 sensing vias 237T for connecting the second sensing patterns 227T and the controller chip 310 are disposed. The wiring region YR may be an area in which at least some of the first to fourth ground vias 231G, 233G, 235G, and 237G for connecting the fourth ground pattern 227G and the controller chip 310 are disposed.

Referring to FIGS. 1A and 1E, the sensing region SR may be disposed at the center of the substrate 200. In some example embodiments, the sensing region SR may have a rectangular or square shape in plan view. In the sensing region SR, a plurality of line-shaped first sensing patterns 225R spaced apart in the first direction (X-direction) and extending in the second direction (Y-direction), and a plurality of line-shaped second sensing patterns 227T spaced apart in the second direction (Y-direction) and extending in the first direction (X-direction), may be disposed.

A first contact region CR1 may be formed at one end of the sensing region SR in the second direction (Y-direction), a third contact region CR3 may be formed at the other end of the sensing region SR in the second direction (Y-direction). A second contact region CR2 may be formed at one end of the sensing region SR in the first direction (X-direction), and a wiring region YR may be formed at the other end of the sensing region SR in the first direction (X-direction).

The peripheral region ER may be disposed on the outer portion of the substrate 200. The peripheral region ER may surround the sensing region SR from a planar perspective. The second bonding pads 221B may be disposed in the peripheral region ER. In the peripheral region ER, the first to fourth ground patterns 221G, 223G, 225G, and 227G may be disposed for providing a reference potential and shielding sensing noise.

The first sensing patterns 225R may extend between the sensing region SR and the first contact region CR1 or between the sensing region SR and the third contact region CR3. The first sensing patterns 225R may be connected to the controller chip 310 through 1-1 sensing vias 231R, 2-1 sensing vias 233R, and 3-1 sensing vias 235R disposed in the first and third contact regions CR1 and CR3. Within the first contact region CR1, the 1-1 sensing vias 231R, 2-1 sensing vias 233R, and 3-1 sensing vias 235R may be respectively arranged in the first direction (X-direction). Within the third contact region CR3, the 1-1 sensing vias 231R, 2-1 sensing vias 233R, and 3-1 sensing vias 235R may respectively be arranged in the first direction (X-direction). Some of the first sensing patterns 225R may be connected to the 1-1 sensing vias 231R, 2-1 sensing vias 233R, and 3-1 sensing vias 235R disposed in the first contact region CR1. Some of the first sensing patterns 225R may be connected to the 1-1 sensing vias 231R, 2-1 sensing vias 233R, and 3-1 sensing vias 235R disposed in the third contact region CR3. Neighboring first sensing patterns 225R may be electrically separated.

The second sensing patterns 227T may extend within the sensing region SR and the second contact region CR2. The second sensing patterns 227T may be connected to the controller chip 310, through the 1-2 sensing vias 231T, the 2-2 sensing vias 233T, the 3-2 sensing vias 235T, and the 4-2 sensing vias 237T disposed in the second contact region CR2. The 1-2 sensing vias 231T, 2-2 sensing vias 233T, 3-2 sensing vias 235T, and 4-2 sensing vias 237T may respectively be disposed in a zigzag manner in the second direction (Y-direction).

The first sensing patterns 225R may have a first width W1, which is the width in the first direction (X-direction), and the second sensing patterns 227T may have a second width W2, which is the width in the second direction (Y-direction). In some example embodiments, the first width W1 may be larger than the second width W2. For example, the first width W1 may have a range of approximately 2 to 4 times the second width W2. For example, the first width W1 may range from about 40 μm to about 70 μm, and the second width W2 may range from about 5 μm to about 25 μm.

Portions where the first sensing patterns 225R and the second sensing patterns 227T overlap in the third direction (Z-direction) may form pixels PX. A first pitch (PIX) in the first direction (X-direction) between centers (PXC) of pixels (PX) may be substantially equal to a second pitch (PIY) in the second direction (Y-direction) between the centers (PXC) of the pixels (PX), but the inventive concepts are not limited thereto. For example, the first pitch (PIX) and the second pitch (PIY) may each range from about 50 μm to about 90 μm.

The pixels (PX) may have a combinational capacitance value of area capacitance (AC) due to the first sensing patterns 225R and the second sensing patterns 227T overlapping each other and fringing capacitance due to the first sensing patterns 225R and the second sensing patterns 227T.

When the user's fingerprint comes into contact with the upper surface 200U of the substrate 200, due to the capacitance induced between the second sensing patterns 227T and the user's fingerprint, the capacitance value corresponding to each pixel PX changes. Since the change in capacitance value is determined by the shape of the user's fingerprint, the controller chip 310 may identify the user's fingerprint from changes in the capacitance values of the pixels (PX).

The fourth ground pattern 227G may two-dimensionally surround the sensing region SR where the second sensing patterns 227T are disposed. The fourth ground pattern 227G is located at the same vertical level as the second sensing patterns 227T and may surround the second sensing patterns 227T in a planar manner. For example, the fourth ground pattern 227G may continuously extend along the edge of the sensing region SR on the upper surface of the upper insulating layer 215 and planarly surround the second sensing patterns 227T. The fourth ground pattern 227G is disposed around the sensing region SR and may function to reduce sensing noise while the user's fingerprint touches the sensing region SR.

The base layer 211 may include an insulating material. The base layer 211 may include resin and glass fiber. The resin included in the base layer 211 may be at least one selected from phenol resin, epoxy resin, and polyimide. In some example embodiments, the base layer 211 may contain at least one substance selected from among Flame Retardant 4 (FR4), tetrafunctional epoxy, polyphenylene ether, epoxy/polyphenylene oxide, THERMOUNT® (a nonwoven aramid fiber reinforced substrate for printed wiring boards), Bismaleimide Triazine (BT), cyanate ester, polyimide, prepreg, Ajinomoto build-up film (ABF), and liquid crystal polymer. In some example embodiments, the base layer 211 may include silicon oxide, silicon nitride, silicon oxynitride, or combinations thereof. The glass fiber included in the base layer 211 serves as a reinforcing material and may be obtained by focusing glass filament obtained by melt-spinning a glass material at high temperature. The glass filament may be a processed ore product containing silica as a main ingredient thereof.

Below, for convenience of descriptions and understanding, the components of the substrate 200 will be described in the order of proximity to the base layer 211.

The second conductive layer (223G, 223R, 223T) may include 2-1 sensing pads 223R, 2-2 sensing pads 223T, and a second ground pattern 223G to which a reference potential is applied. The second ground pattern 223G may be disposed in the sensing region SR, wiring region YR, and peripheral region ER. A portion of the second ground pattern 223G may overlap the first and second sensing patterns 225R and 227T in the third direction (Z-direction). A portion of the second ground pattern 223G may be interposed between the second sensing patterns 227T and the controller chip 310. Accordingly, the second ground pattern 223G may block external sensing noise from the controller chip 310. The 2-1 sensing pads 223R may be disposed in the first and third contact regions CR1 and CR3, and the 2-2 sensing pads 223T may be disposed in the second contact region CR2. The 2-1 sensing pads 223R may provide a path for electrical connection between the first sensing patterns 225R and the controller chip 310, and the 2-2 sensing pads 223T may provide a path for electrical connection between the second sensing patterns 227T and the controller chip 310.

The lower insulating layer 213 may be disposed on the lower surface of the base layer 211 to cover the second conductive layers 223G, 223R, and 223T. The lower insulating layer 213 may electrically separate the 2-1 sensing pads 223R, the 2-2 sensing pads 223T, and the second ground pattern 223G from each other.

The third conductive layer (225G, 225R, 225T) may include a third ground pattern 225G to which a reference potential is applied, first sensing patterns 225R for recognizing a user's fingerprint, and 3-2 sensing pads 225T. The first sensing patterns 225R may be disposed in the sensing region SR, the third ground pattern 225G may be disposed in the wiring region YR and the peripheral region ER, and the 3-2 sensing pads 225T may be disposed in the second contact region CR2. The 3-2 sensing pads 225T may provide a path for electrical connection between the second sensing patterns 227T and the controller chip 310.

The upper insulating layer 215 may be disposed on the upper surface of the base layer 211 to cover the third conductive layers 225G, 225R, and 225T. The upper insulating layer 215 may electrically separate the first sensing patterns 225R, the 3-2 sensing pads 225T, and the third ground pattern 223G from each other.

The lower insulating layer 213 and the upper insulating layer 215 may include different materials. For example, the upper insulating layer 215 may include a material having a dielectric constant suitable for fingerprint recognition of the fingerprint sensor package 10. However, the inventive concepts are not limited thereto, and the lower insulating layer 213 and the upper insulating layer 215 may include the same material.

Each of the lower insulating layer 213 and the upper insulating layer 215 may include at least one selected from phenol resin, epoxy resin, and polyimide. In some example embodiments, each of the lower insulating layer 213 and the upper insulating layer 215 may include at least one selected from prepreg, FR4, quadrilateral epoxy, polyphenylene ether, epoxy/polyphenylene oxide, THERMOUNT® (a nonwoven aramid fiber reinforced substrate for printed wiring boards), BT, cyanate ester, polyimide, and liquid crystal polymer.

The fourth conductive layers 227G and 227T may be disposed on the upper surface of the upper insulating layer 215. The fourth conductive layers 227G and 227T may include a fourth ground pattern 227G for removing sensing noise and second sensing patterns 227T for recognizing the user's fingerprint. The second sensing patterns 227T may be disposed in the sensing region SR, and the fourth ground pattern 227G may be disposed in the peripheral region ER.

The second sensing patterns 227T may be spaced apart from the first sensing patterns 225R in a third direction (Z-direction) with the insulating layer 215 interposed therebetween. For example, the second sensing patterns 227T may be electrically insulated from the first sensing patterns 225R by the upper insulating layer 215. Accordingly, the first sensing patterns 225R constitute the first electrode of the capacitor, the upper insulating layer 215 constitutes the dielectric layer of the capacitor, and the second sensing patterns 227T may form the second electrode of the capacitor. For example, capacitors constituting the fingerprint sensor may be formed within the substrate 200.

The upper protective layer 219 may be disposed on the upper surface of the upper insulating layer 215 to cover the fourth conductive layers 227G and 227T.

The first conductive layer (221B, 221G, 221R, 221T, 221P) may be disposed on the lower surface of the lower insulating layer 213. The first conductive layer (221B, 221G, 221R, 221T, 221P) may include second bonding pads 221B, 1-1 sensing pads 221R, 1-2 sensing pads 221T, and a first ground pattern 221G to which a reference potential is applied.

The second bonding pads 221B may be connected to the plurality of bumps 400, and may be electrically connected to first bonding pads 120 of the film substrate 100 through a plurality of bumps 400. The second bonding pads 221B may include a power pad to which power (for example, power potential) provided from an external device is applied, a ground pad to which a reference potential is applied, and an output pad for outputting the fingerprint recognition results of the fingerprint sensor package 10 to the outside (for example, the display unit 12 of the device 1 in FIG. 2H). The controller chip 310 receives the power potential through some of the second bonding pads 221B and the power pattern 221P, and the reference potential may be transmitted through other pads of the second bonding pads 221B and the first ground pattern 221G. Additionally, the controller chip 310 may receive signals recognized in the first and second sensing patterns 225R and 227T through the 1-1 sensing pads 221R and 1-2 sensing pads 221T.

The 1-1 sensing pads 221R may extend from the first and third contact regions CR1 and CR3 to a portion overlapping with the controller chip 310 in the third direction (Z-direction), and the 1-2 sensing pads 221T may extend from the second contact region CR2 to a portion overlapping the controller chip 310 in the third direction (Z-direction). The 1-1 sensing pads 221R may provide a path for electrical connection between the first sensing patterns 225R and the controller chip 310, and the 1-2 sensing pads 221T may provide a path for electrical connection between the second sensing patterns 227T and the controller chip 310.

The lower protective layer 217 may be disposed on the lower surface of the lower insulating layer 213 to cover at least a portion of the first conductive layers 221B, 221G, 221R, 221T, and 221P. In some example embodiments, the lower protective layer 217 may be formed to cover a portion of the lower surface of the lower insulating layer 213. In example some other example embodiments, the lower protective layer 217 may be formed to entirely cover the lower surface of the lower insulating layer 213.

Each of the lower protective layer 217 and the upper protective layer 219 may be an insulating coating layer. In some example embodiments, the lower protective layer 217 and the upper protective layer 219 may be formed of solder resist. In some other example embodiments, the lower protective layer 217 and the upper protective layer 219 may include a polymer material with excellent heat resistance, insulation, and hardness. For example, the lower protective layer 217 and the upper protective layer 219 may each be formed of polyimide, polyamide, polyacetal, polycarbonate, etc. In some example embodiments the upper protective layer 219, in contact with the user's fingerprint, may be formed of a material with a higher hardness than the lower protective layer 217 to protect against external influences such as contamination, impact, and scratches. For example, the upper protective layer 219 and the lower protective layer 217 may be formed of solder resist, and the upper protective layer 219 may be formed of high hardness solder resist having a hardness of 4H or more. In some example embodiments, the upper protective layer 219 may include a material with a dielectric constant suitable for recognition of a fingerprint (for example, a high dielectric material).

The film substrate 100 may have (and/or define) a penetration (e.g., through-hole) region 110H in which a portion of the substrate 200 overlaps in the vertical direction (for example, Z-direction). The film substrate 100 may be spaced apart from the substrate 200, and a plurality of bumps 400 may be disposed on the upper surface of the film substrate 100 to electrically connect the film substrate 100 and the substrate 200. A plurality of external connection pads 130 may be disposed on the lower surface of the film substrate 100 and electrically connected to the substrate 200 through the plurality of bumps 400.

The film substrate 100 may include at least one of a film insulating layer 110, first bonding pads 120, external connection pads 130, a ground bezel 150, an adhesive layer 160, and a conductive via 170.

The film insulating layer 110 may have higher flexibility than the flexibility of the upper insulating layer 215 of the substrate 200. For example, the film insulating layer 110 may include a highly flexible insulating material such as polyimide. The flexibility of polyimide may be higher than flexibility of prepreg. The insulating material of the film insulating layer 110 is not limited to polyimide, and may be formed of synthetic resin such as epoxy resin, acrylic, polyether nitrile, polyether sulfone, polyethylene ctereph- thalate, polyethylene naphthalate, or the like.

The film insulating layer 110 may have a substantially rectangular planar shape or square planar shape, and may be provided in flexible film or plate form. The film insulating layer 110 may include an upper surface 111 and a lower surface 113 that are opposed to each other. In some example embodiments, the direction parallel to the pair of edges of the film insulating layer 110 is defined as the first direction (X-direction), the direction parallel to the other pair of edges is defined as the second direction (Y-direction), and the direction perpendicular to the main surface (upper surface 111 or lower surface 113) of the film insulating layer 110 is defined as the third direction (Z-direction).

The plurality of first bonding pads 120 may be arranged along the edge of the penetration region 110H on the upper surface 111 of the film insulating layer 110 and may be spaced apart from each other. The plurality of first bonding pads 120 are connected to the plurality of bumps 400, and may be electrically connected to the plurality of second bonding pads 221B of the substrate 200 through the plurality of bumps 400. For example, the plurality of first bonding pads 120 and the plurality of external connection pads 130 may include at least one selected from copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), and alloys thereof.

The ground bezel 150 may be disposed on the upper surface 111 of the film insulating layer 110 and around the penetration region 110H. When the penetration region 110H is formed in approximately the center of the upper surface 111 of the film insulating layer 110, the ground bezel 150 may be disposed on the outer portion of the upper surface 111 of the film insulating layer 110. The ground bezel 150 is disposed around the penetration region 110H, and may function to reduce sensing noise while the user's fingerprint contacts the upper surface 200U of the substrate 200. For example, the ground bezel 150 may include a conductive material, for example, a metal such as copper (Cu) or aluminum (Al).

The ground bezel 150 may be electrically grounded. In some example embodiments, the ground bezel 150 may be configured to receive a reference potential through a conductive via 170 penetrating the film insulating layer 110 and the adhesive layer 160. The conductive via 170 is configured to electrically connect the ground bezel 150 and the external connection pad 130, and may be used as an electrical path to transmit the reference potential to the ground bezel 150.

The ground bezel 150 may extend along the perimeter of the penetration region 110H. The ground bezel 150 may have a ring shape that two-dimensionally surrounds the penetration region 110H. For example, the ground bezel 150 may be spaced apart from the penetration region 110H, and the upper surface 100U of the ground bezel 150 may be disposed at an upper level than the upper surface of the plurality of first bonding pads 120.

The controller chip 310 may be disposed in the penetration region 110H and electrically connected to the substrate 200. The controller chip 310 and a passive element 320 may be disposed on the lower surface 200B of the substrate 200. The controller chip 310 may be mounted on the lower surface 200B of the substrate 200 using a flip-chip method. Connection bumps 315 may be disposed between the controller chip 310 and the substrate 200 to electrically and physically connect the controller chip 310 and the substrate 200. The connection bumps 315 may be disposed between some patterns of the first conductive layers 221B, 221G, 221R, 221T, and 221P and the chip pads 311 of the controller chip 310.

In some example embodiments, the controller chip 310 may be entirely or partially disposed within the sensing region SR. In some other example embodiments, the controller chip 310 may be disposed entirely outside the sensing region SR. The controller chip 310 may include any component required to perform an operation for recognizing the user's fingerprint from changes in capacitance values of the pixels PX, such as a memory chip and/or a processor chip. Additionally, the passive element 320 may include, for example, a multi-layer ceramic capacitor (MLCC), but is not limited thereto.

The location of stress concentration due to the difference in flexibility between the film substrate 100 and the substrate 200 may be closer to an upper portion of the substrate 200 than to the lower portion. The penetration region 110H of the film substrate 100 may be closer to the bottom of the substrate 200 than to the top. The controller chip 310 may be disposed in the penetration region 110H, and may thus be moved away from the stress concentration location, thereby having substantially high durability.

The plurality of bumps 400 may electrically connect the substrate 200 and the film substrate 100, and may be electrically connected between the plurality of first bonding pads 120 and the plurality of second bonding pads 221B. The plurality of bumps 400 may efficiently bond the separately provided substrate 200 and the film substrate 100 to each other.

The plurality of bumps 400 may not extend in an elongated manner, unlike wires, and may be close to a ball shape. Compared to wires, the plurality of bumps 400 may be more advantageous in increasing the reliability (for example, electrical short prevention performance, breakage prevention performance) of the electrical connection between the substrate 200 and the film substrate 100. The plurality of bumps 400 may reduce the factor weakening the bonding stability between the film substrate 100 and the substrate 200 due to the difference in flexibility between the film substrate 100 and the substrate 200.

in some example embodiments, the plurality of bumps 400 may support the substrate 200 or the film substrate 100, between the substrate 200 and the film substrate 100, and may be advantageous to optimize a separation distance between the substrate 200 and the film substrate 100. For example, the size of the plurality of bumps 400 may affect the separation distance between the substrate 200 and the film substrate 100. Whether the lower surface of the controller chip 310 is located at a lower level than the lower surface 113 of the film substrate 100 may vary depending on the separation distance between the substrate 200 and the film substrate 100, and may affect the durability of the controller chip 310 and may also affect the coupling structure between the fingerprint sensor package 10 and the device (1 in FIG. 2H). Accordingly, the plurality of bumps 400 may indirectly affect the durability of the controller chip 310 or the coupling structure between the fingerprint sensor package 10 and the device (1 in FIG. 2H).

A height (T1 in FIG. 2F) from the lower surface 113 of the film substrate 100 to the lower surface 200B of the substrate 200 may be greater than a height (T2 in FIG. 2F) from the lower surface of the controller chip 310 to the lower surface 200B of the substrate 200. Accordingly, the impact of external impact of the fingerprint sensor package 10 on the controller chip 310 may be reduced. The actual durability of the controller chip 310 may be improved. The degree of freedom in the structure in which the fingerprint sensor package 10 is assembled into the device (1 in FIG. 2h) may be further increased. The total thickness (for example, the height from the lower surface 113 of the film substrate 100 to the upper surface 200U of the substrate 200) of the fingerprint sensor package 10 may be limited and/or prevented from further increasing because of the controller chip 310, and thus, the fingerprint sensor package 10 may be further miniaturized. For example, the height (T1 in FIG. 2F) from the lower surface 113 of the film substrate 100 to the lower surface 200B of the substrate 200 may be adjusted by the size of the plurality of bumps 400.

The melting point of the plurality of bumps 400 may be lower than the melting point of the plurality of first bonding pads 120 and may be lower than the melting point of the plurality of second bonding pads 221B, and may be lower than the melting point of the plurality of external connection pads 130. For example, the plurality of bumps 400 may include a conductive material with a low melting point, such as lead (Pb), bismuth (Bi), tin (Sn), or tin alloy (Sn—Ag—Cu). At a temperature higher than the melting point thereof, the plurality of bumps 400 may be in a fluid state by a reflow process or a thermal compression bonding (TCB) process. Thereafter, as the temperature decreases, the plurality of bumps 400 may be connected to and fixed to the plurality of first bonding pads 120 and the plurality of second bonding pads 221B. Depending on the design, non-conductive paste (NCP) may be additionally disposed to surround the plurality of bumps 400. Alternatively, the plurality of bumps 400 may directly contact at least one of the first and second encapsulants 351 and 352.

A portion of an encapsulant 350 is disposed in the penetration region 110H to seal at least a portion of the controller chip 310, and another portion of the encapsulant 350 may surround the substrate 200 on the upper surface 111 of the film substrate 100. A portion different from the portion of the encapsulant 350 may be a first encapsulant 351 and a second encapsulant 352. At least a portion of the first encapsulant 351 may be disposed in the penetration region 110H to seal at least a portion of the controller chip 310, and the second encapsulant 352 may surround the substrate 200 on the upper surface 111 of the film substrate 100.

The encapsulant 350 may serve to protect the substrate 200, the controller chip 310, and the passive element 320 from external influences such as contamination and shock. The encapsulant 350 may be formed of epoxy molding compound. Alternatively, the encapsulant 350 may be formed of an epoxy-based material, a thermosetting material, a thermoplastic material, or a UV-treated material. For example, the upper and/or lower surfaces of the encapsulant 350 may be concave or convex due to a meniscus generated during the manufacturing process.

Since the fingerprint sensor package 10 of some example embodiments includes a sensing region SR corresponding to a fingerprint recognition sensor in the substrate 200 itself, the overall thickness may be reduced, and the fingerprint sensor package 10 of some example embodiments may be used to manufacture smart cards with a thickness equivalent to the thicknesses of credit cards and check cards of the related art. In some example embodiments of the fingerprint sensor package 10, since the sensing region SR of the substrate 200 is exposed externally and comes into direct contact with the user's fingerprint, the reliability and sensitivity of acquiring fingerprint information may be improved.

The fingerprint sensor package 10 in some example embodiments may have a total thickness of about 0.76 mm or less. In some example embodiments, the total thickness of the fingerprint sensor package 10 may be about 0.5 mm or less. For example, the total thickness of the fingerprint sensor package 10 may range from about 0.1 mm to 0.4 mm. Accordingly, the fingerprint sensor package 10 may be easily applied to various products (for example, smart cards) that are curved or require a small and/or reduced thickness.

Figure 2A:
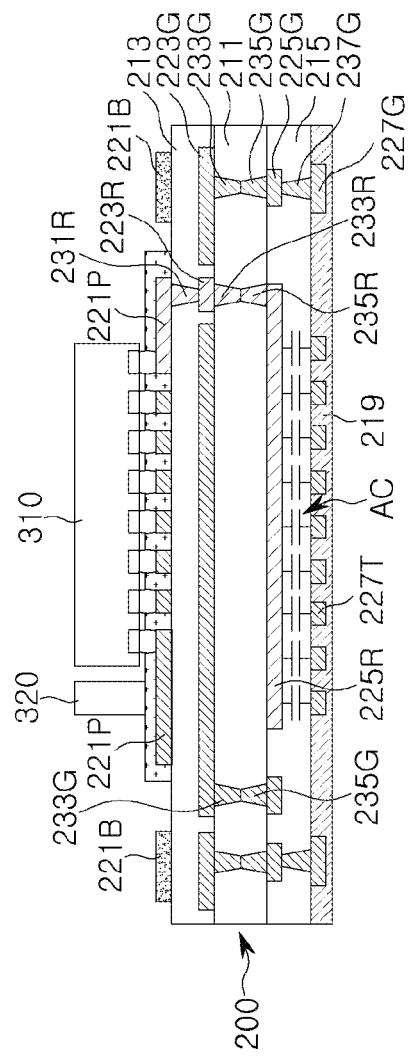
FIGS. 2A, 2B, 2C, 2D, 2E, 2F, 2G and 2H are diagrams illustrating a process of manufacturing a fingerprint sensor package and assembling the same into a device according to some example embodiments of the inventive concepts.
Figure 2B:
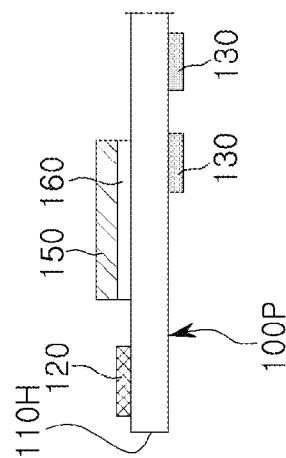
Figure 2B:
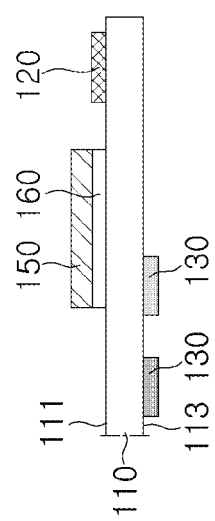
Figure 2C:
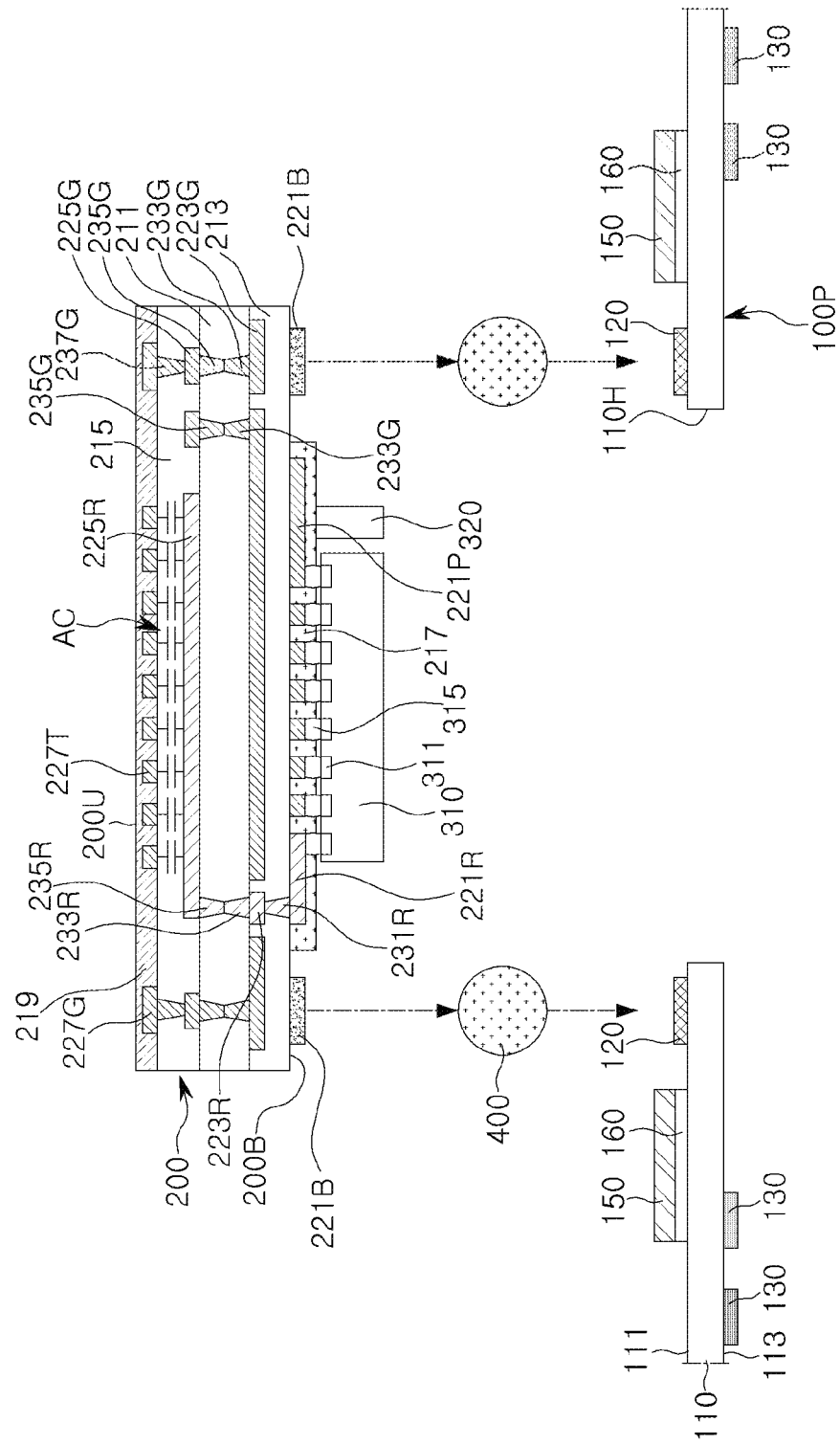

FIGS. 2A to 2C illustrate a process of manufacturing a fingerprint sensor package 10 according to some example embodiments, and FIGS. 2D to 2G illustrate a process of assembling the fingerprint sensor package 10 into the device 1 according to some example embodiments.

Referring to FIG. 2A, a substrate 200 is prepared, and a controller chip 310 and passive elements 320 are mounted on the substrate 200. The controller chip 310 may be mounted on the substrate 200 using a flip chip method.

Referring to FIG. 2B, a first panel substrate 100P on which the substrate 200 is to be mounted is prepared. Most of component elements constituting the first panel substrate 100P and materials forming the component elements are substantially the same as or similar to those of the film substrate 100. However, the first panel substrate 100P may have a larger planar area than the film substrate 100 so that a plurality of substrates 200 may be mounted. The first panel substrate 100P may be mounted on a winding reel facility, and reeling and releasing of the first panel substrate 100P may be controlled by the winding ring facility. The substrate 200 may be provided with a through-hole 110H formed therein.

Referring to FIG. 2C, the substrate 200 is bonded to the first panel substrate 100P. The second bonding pads 221B of the substrate 200 may be respectively thermocompressively bonded to the first bonding pads 120 of the first panel substrate 100P. The plurality of bumps 400 may be connected between the plurality of first bonding pads 120 and the plurality of second bonding pads 221B. Accordingly, the substrate 200 may be firmly bonded to the first panel substrate 100P. The controller chip 310 and the passive element 320 mounted on the lower surface 200B of the substrate 200 may be accommodated in the through-hole 110H of the first panel substrate 100P.

Figure 2D:
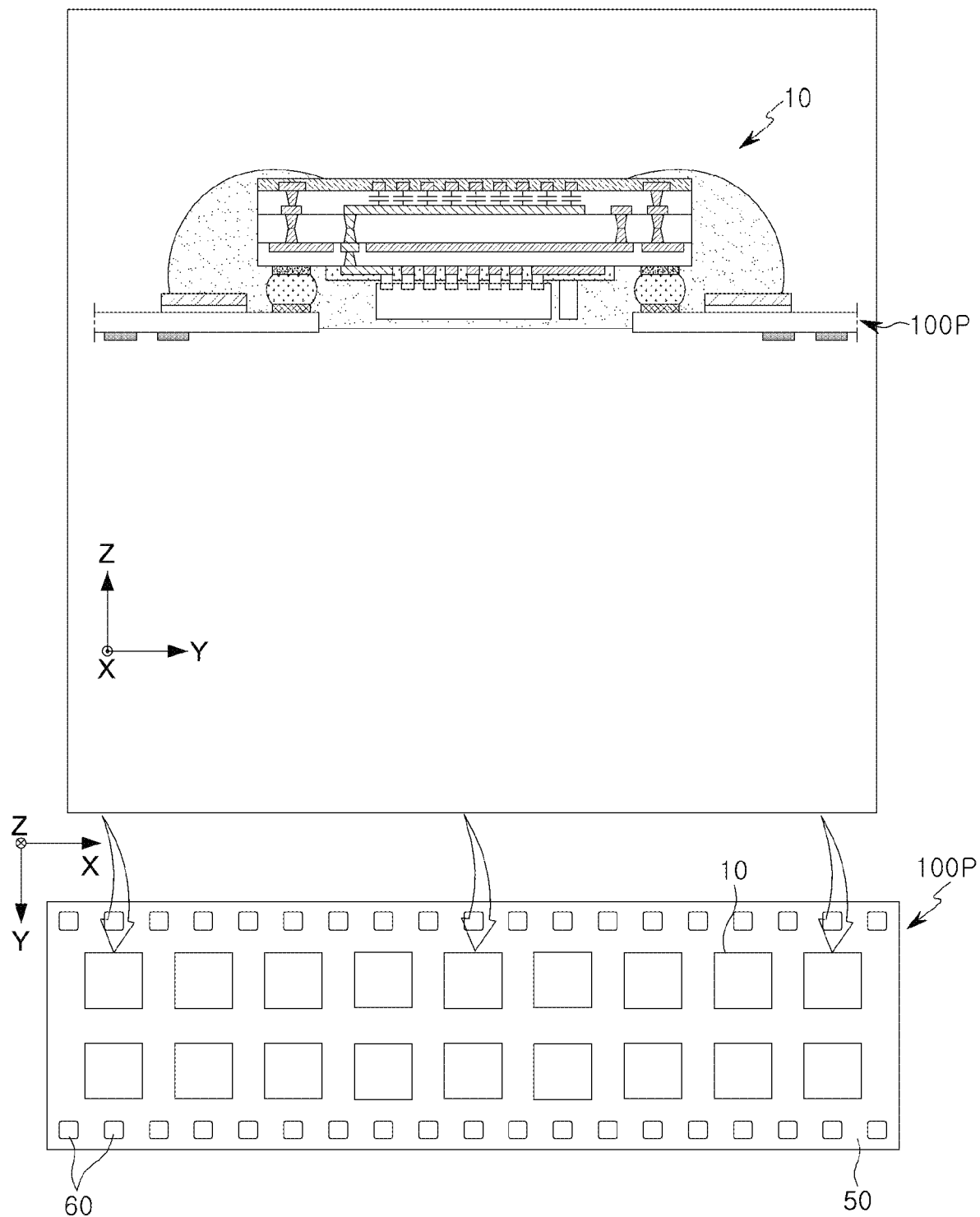

Referring to FIG. 2D, a plurality of fingerprint sensor packages 10 may be arranged on the first panel substrate 100P. The first panel substrate 100P may have a form in which a plurality of through-holes 60 are arranged on both sides (for example, the Y-direction side), respectively. Accordingly, the first panel substrate 100P may be efficiently provided to the infrastructure for assembling the plurality of fingerprint sensor packages 10 into corresponding devices in a reel-to-reel manner. For example, the teeth of a sprocket included in the infrastructure may be inserted into the plurality of through-holes 60, and the sprocket may wind or unwind the first panel substrate 100P by rotating. The size, shape, density, and arrangement direction of the plurality of through-holes 60 may vary depending on the sprocket. For example, the area of each of the plurality of through-holes 60 may be smaller than the area of the upper surface of each of the substrates 200, and the shape of each of the plurality of through-holes 60 may be circular or polygonal (including polygons with chamfered corners). The plurality of through-holes 60 may be defined as sprocket holes, but are not limited thereto.

Figure 2E:
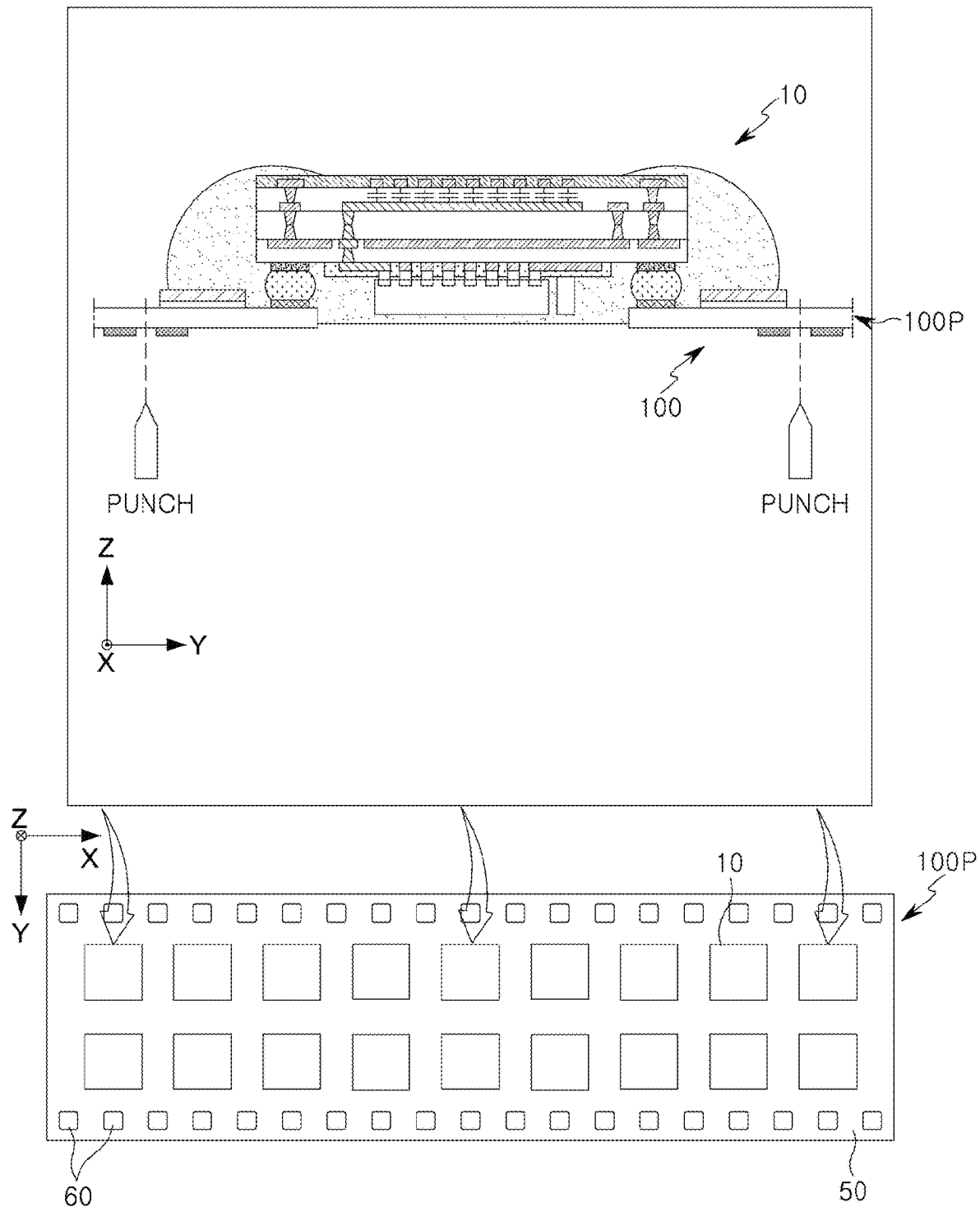
Figure 2F:
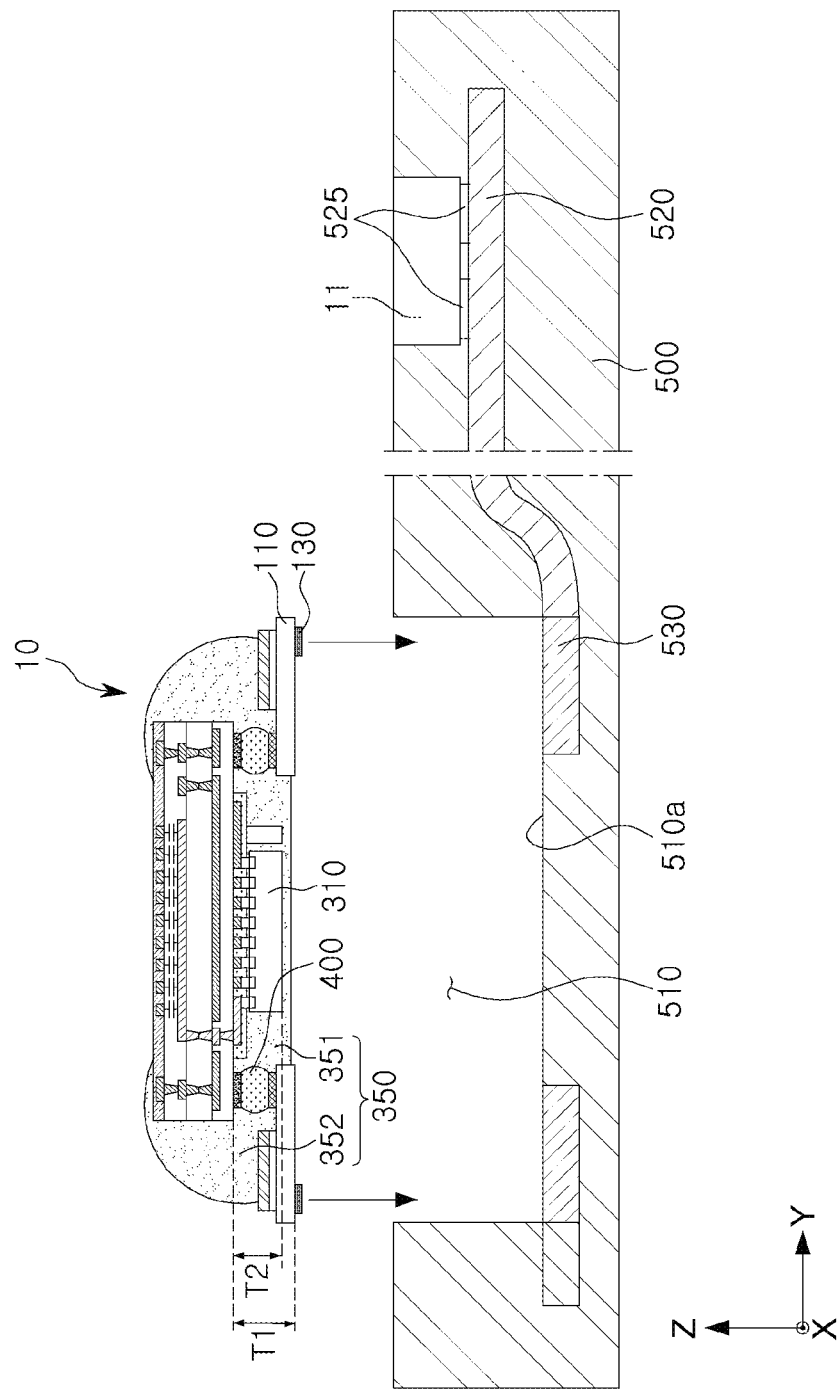
Figure 2G:
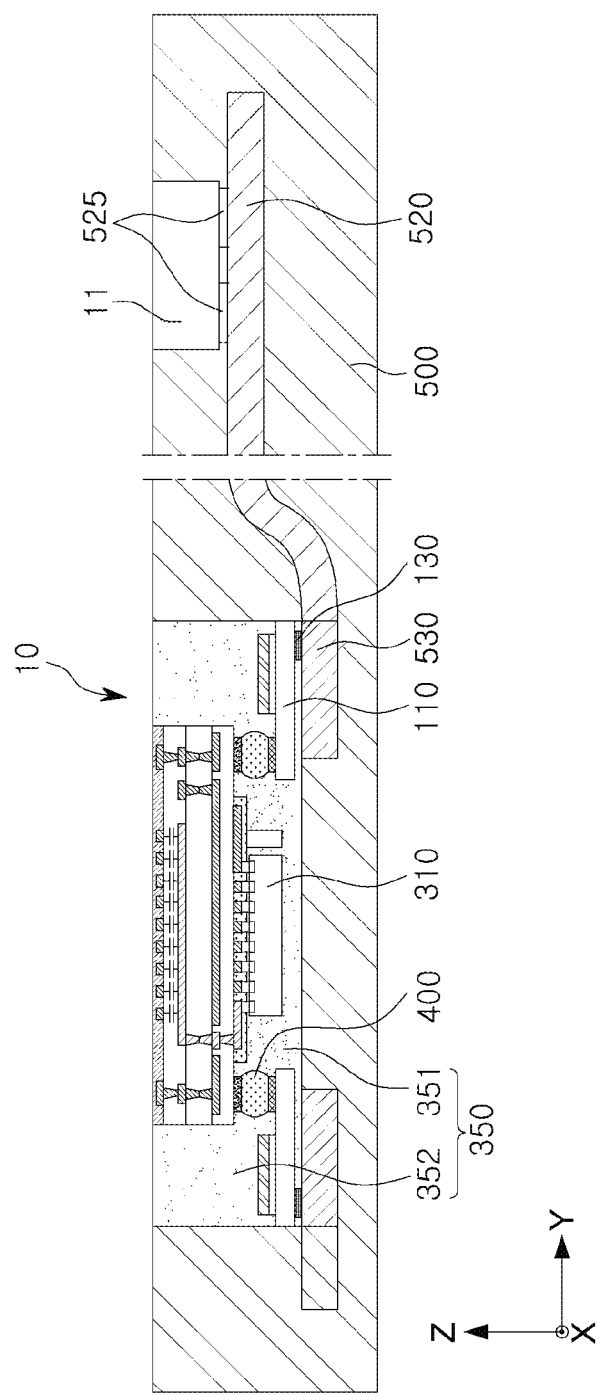
Figure 2H:
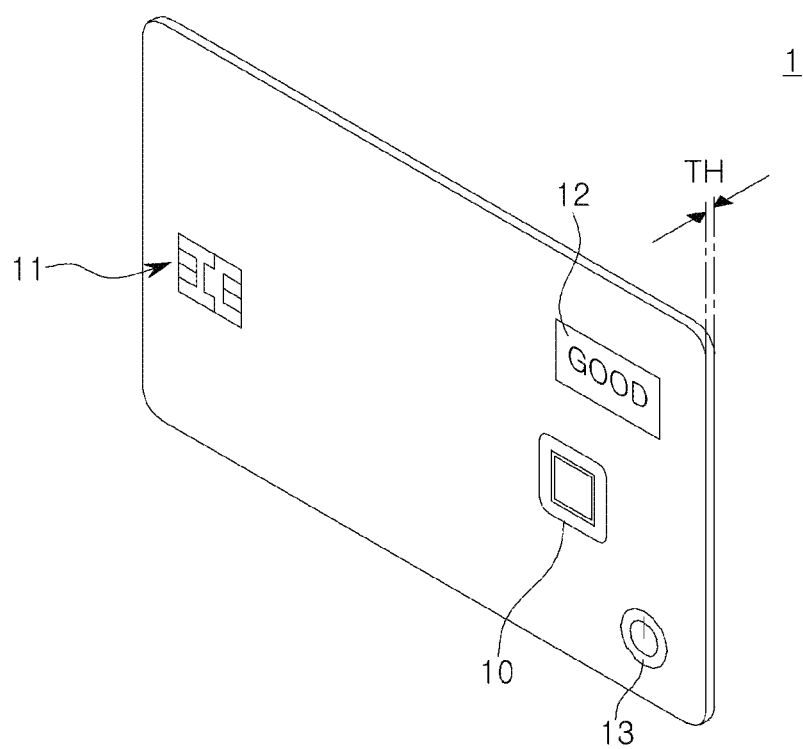

Referring to FIG. 2E, a portion of the first panel substrate 100P corresponding to the film substrate 100 may be separated from the first panel substrate 100P by a punch process. Referring to FIGS. 2F to 2H, the fingerprint sensor package 10 may be inserted and disposed into a recessed region 510 of the device 1.

The device may include a device body 500 having the recessed region 510, a device substrate 520 disposed in the device body 500, a device chip 11 electrically connected to the device substrate 520, and a plurality of terminals 530 disposed in the recessed region 510 and electrically connected to the device substrate 520. The fingerprint sensor package 10 may be disposed in the recessed region 510 to be electrically connected to a plurality of terminals 530.

The plurality of terminals 530 may be disposed on a lower surface 510a of the recessed region 510, but may also be disposed on the side of the recessed region 510 depending on the design. For example, the plurality of terminals 530 may be implemented using an inlay method. Depending on the design, an anisotropic conductive film may be disposed between the plurality of terminals 530 and the plurality of external connection pads 130. For example, the anisotropic conductive film may have a structure in which conductive particles having a diameter of 3 μm or more and 15 μm or less are dispersed within an adhesive polymer. The device substrate 520 may be implemented as a flexible printed circuit board and may be embedded in the device body 500.

The device chip 11 may be mounted on the device substrate 520 through device bumps 525. Accordingly, the device chip 11 may be electrically connected to the fingerprint sensor package 10 through the plurality of terminals 530 electrically connected to the device substrate 520. The device chip 11 may store financial information and may be exposed to the upper surface of the device body 500.

Since the height (T1) from the bottom of the film substrate 100 to the bottom of the substrate 200 may be greater than the height (T2) from the bottom of the controller chip 310 to the bottom of the substrate 200, even if the lower surface 510a of the recessed region 510 does not have a step shape, the controller chip 310 may not contact the lower surface 510a of the recessed region 510. Accordingly, the degree of freedom in the shape (for example, hexahedron) of the recessed region 510 may be further increased.

The height freedom of the recessed region 510 may also be increased. Referring to FIGS. 1C, 2F and 2G, the lower surface 200B of the substrate 200 of the fingerprint sensor package 10 may be located within the recessed region 510. For example, the lower surface 200B of the substrate 200 of the fingerprint sensor package 10 may be disposed on a lower level than the upper surface of the device body 500. The encapsulant 350 of FIG. 1C may fill most of the space of the recessed region 510 of FIG. 2F.

Referring to FIG. 2H, the device 1 may include a fingerprint sensor package 10, a device chip 11, a display unit 12, and a power button 13.

For example, the device 1 may be a smart card, but is not limited thereto. For example, the device 1 may be configured to be draped or planted on the user of the device 1, such as a wearable electronic device, and may be configured to be mounted on an electronic device (for example, a vehicle, a portable terminal) larger than the device 1. When a user touches the fingerprint sensor package 10 of the device 1, the touched fingerprint may be recognized. When the recognized fingerprint matches the registered fingerprint, the device chip 11 may grant payment authority to the user of the device 1.

A smart card, which may be a type of the device 1, may further include information displayed on an existing credit card or check card, such as a card number identification unit, an expiration date identification unit, a user name and the like. In some example embodiments, the device 1 may further include an RF chip.

When a user touches his or her fingerprint to the fingerprint sensor, the fingerprint sensor package 10 may recognize the touched fingerprint. The fingerprint sensor package 10 may compare the recognized fingerprint and the registered fingerprint to determine whether the recognized fingerprint matches the registered fingerprint. The fingerprint sensor package 10 may operate after the device 1 is switched to the on state.

For example, the device chip 11 may be a security chip and may store encrypted financial information. For example, when the recognized fingerprint matches the registered fingerprint, the device chip 11 may grant payment authority to the user of the device 1. For example, as the device chip 11 grants payment authority to the user based on the recognition result of the fingerprint sensor package 10, the device 1 may limit and/or prevent financial accidents caused by theft or loss.

The display unit 12 may display whether the recognized fingerprint matches the registered fingerprint, whether it is on/off, and the like. The display unit 12 may display letters, numbers, special symbols, and the like, and in some cases, may further include a light emitting unit. However, depending on the type of the device 1, the display unit 12 may be omitted.

The power button 13 may turn the device 1 on/off. The device 1 in the off state may be switched to the on state by operating the power button 13, and the device 1 in the on state may be switched to the off state by operating the power button 13. Additionally, when a set time elapses after the device 1 is switched to the on state, the device 1 may be automatically switched to the off state. However, depending on the type of the device 1, the power button 13 may be omitted.

In some example embodiments, a thickness (TH) of the device 1 may range from approximately 0.5 mm to 1 mm. Additionally, the thickness (TH) of the device 1 may be about 0.84 mm or less in accordance with international standards. For example, the thickness (TH) of the device 1 may be about 0.76 mm or less.

A smart card, which may be a type of the device 1, may include the fingerprint sensor package 10 and have the same thickness as an existing credit or check card, and may thus provide users with a high level of security while maintaining the manner in which traditional credit or check cards are used.

Figure 3A:
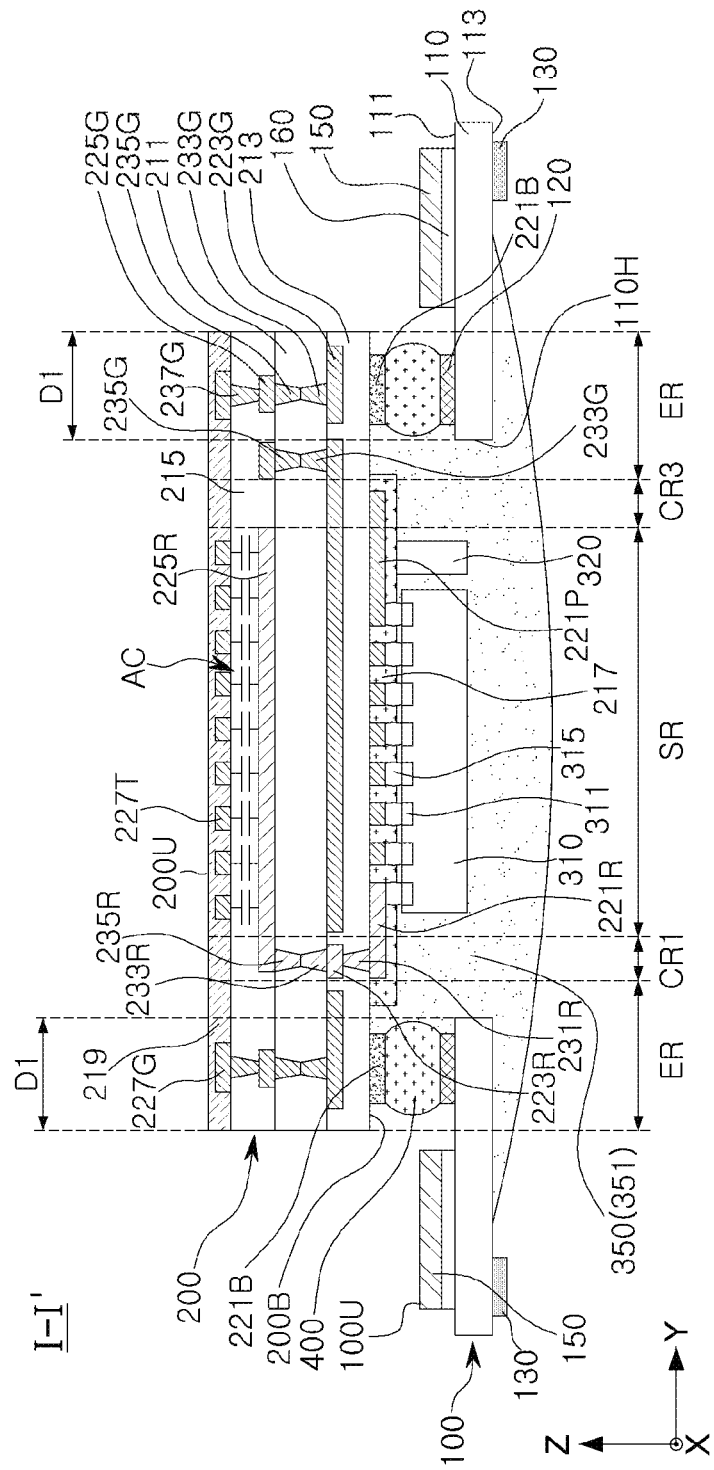
FIGS. 3A, 3B and 3C are diagrams illustrating a process of assembling a fingerprint sensor package into a device according to some example embodiments of the inventive concepts.
Figure 3B:
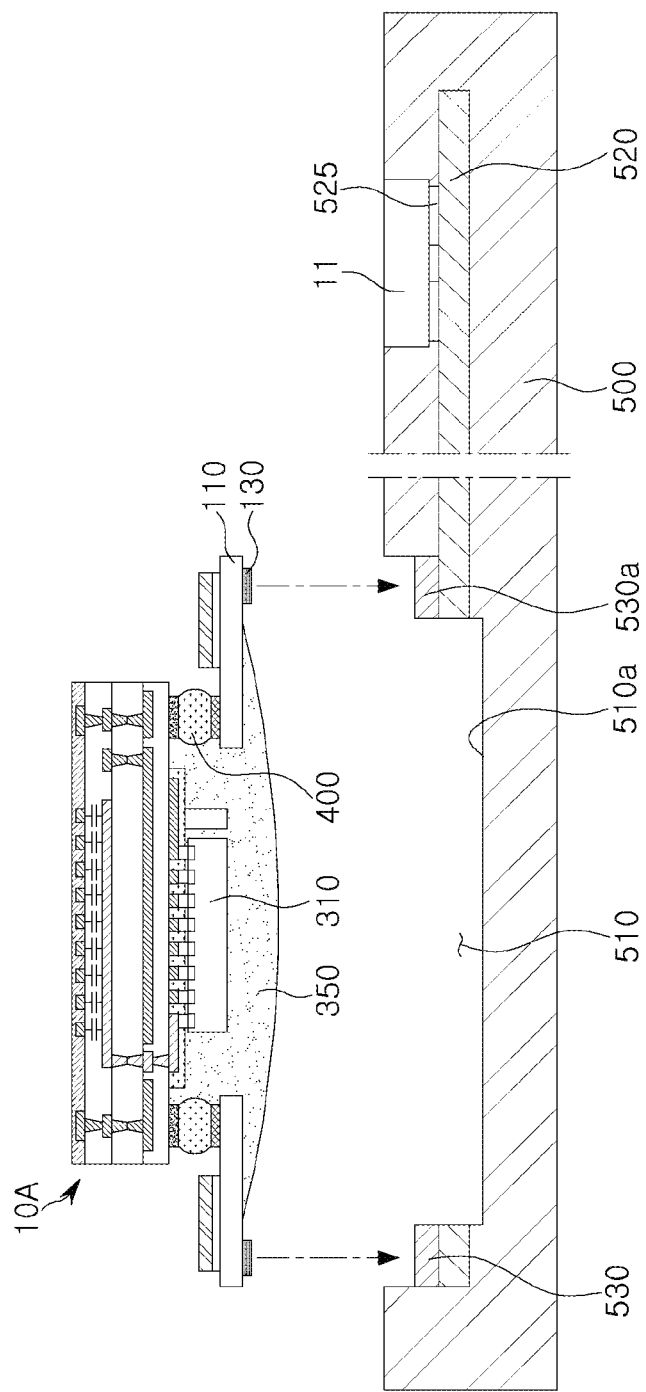
Figure 3C:
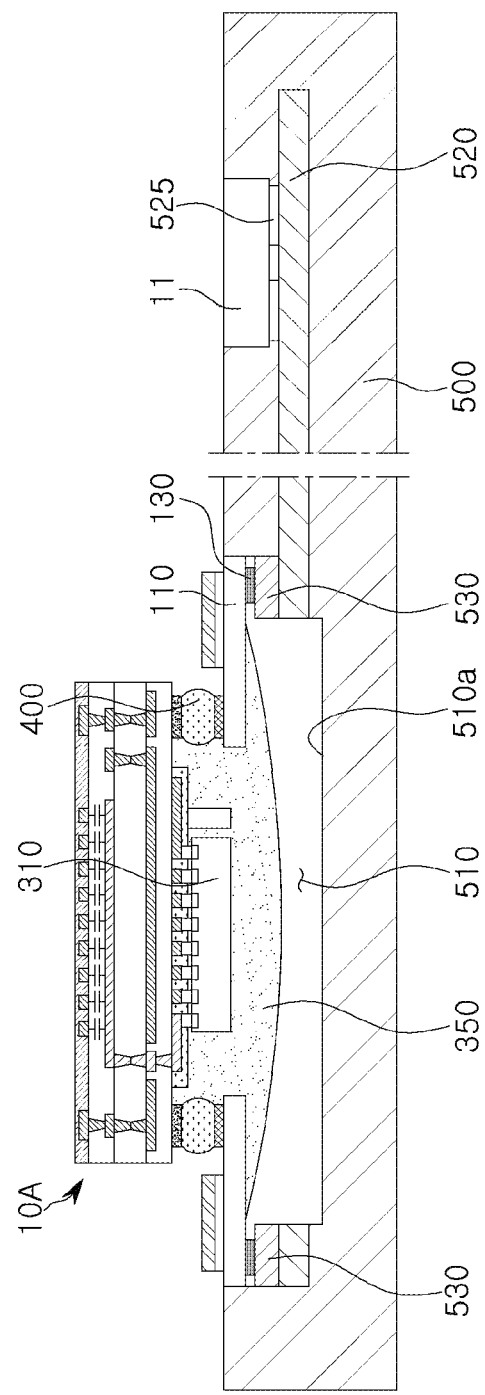

FIG. 3A illustrates that the structure of the encapsulant 350 of a fingerprint sensor package 10A according to some example embodiments is different from the structure of the encapsulant 350 of FIG. 1C, and FIGS. 3B and 3C illustrate the fingerprint sensor package 10A of FIG. 3A being assembled into a device.

Referring to FIG. 3A, the encapsulant 350 may not include a portion corresponding to the second encapsulant 352 of FIG. 1C, and may have a structure in which the volume of the portion corresponding to the first encapsulant 351 of FIG. 1C is increased.

Referring to FIGS. 3B and 3C, the recessed region 510 of the device may have a structure in which the outer portion of the recessed region 510 has a step shape, and the plurality of terminals 530 and 530a may be disposed on the upper surface of the step shape. Accordingly, the fingerprint sensor package 10 may protrude upwardly of the recessed region 510.

Figure 4:
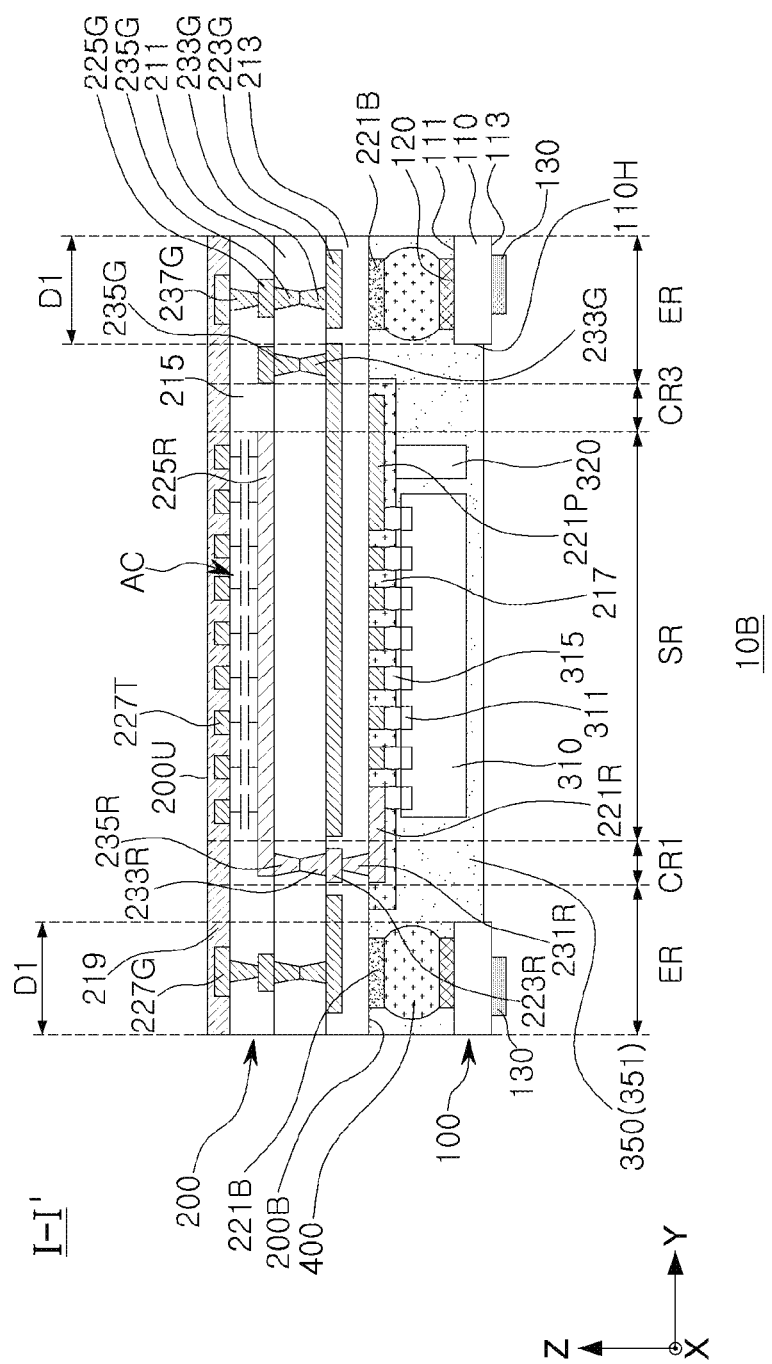
FIG. 4 is a cross-sectional view illustrating a fingerprint sensor package according to some example embodiments of the inventive concepts.

FIG. 4 illustrates that the horizontal area of the film substrate 100 of a fingerprint sensor package 10B according to an example some example embodiments is different from the horizontal area of the film substrate 100 of FIG. 1C. The horizontal area of the film substrate 100 may be adjusted by adjusting the position of the punch process illustrated in FIG. 2E. Depending on the design, the punch process may be applied not only to the film substrate 100 but also to the substrate 200. Therefore, the side surface of the film substrate 100 and the side surface of the substrate 200 may be coplanar.

Figure 5:
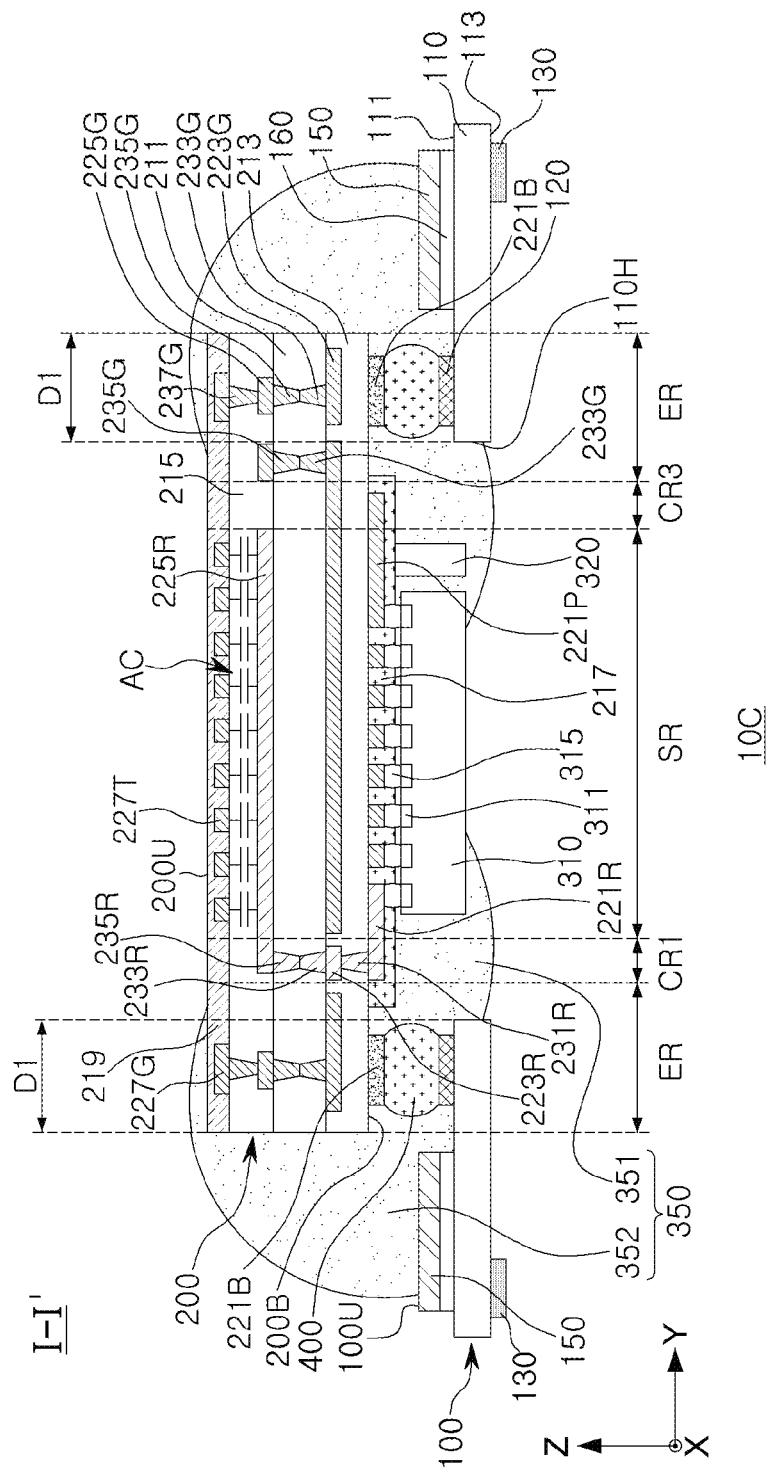
FIG. 5 is a cross-sectional view illustrating a fingerprint sensor package according to some example embodiments of the inventive concepts.

FIG. 5 illustrates that the structure of the first encapsulant 351 of a fingerprint sensor package 10C according to some example embodiments is different from the structure of the first encapsulant 351 of FIG. 1C. Referring to FIG. 5, a portion of the lower surface of the controller chip 310 may be exposed without contacting the first encapsulant 351. When the fingerprint sensor package 10C is disposed in the recessed region of the device, the lower surface of the controller chip 310 may not contact the device, and thus, the first encapsulant 351 may be disposed to protect the controller chip 310 by focusing more on the side surface of the controller chip 310 than on the lower surface.

Figure 6:
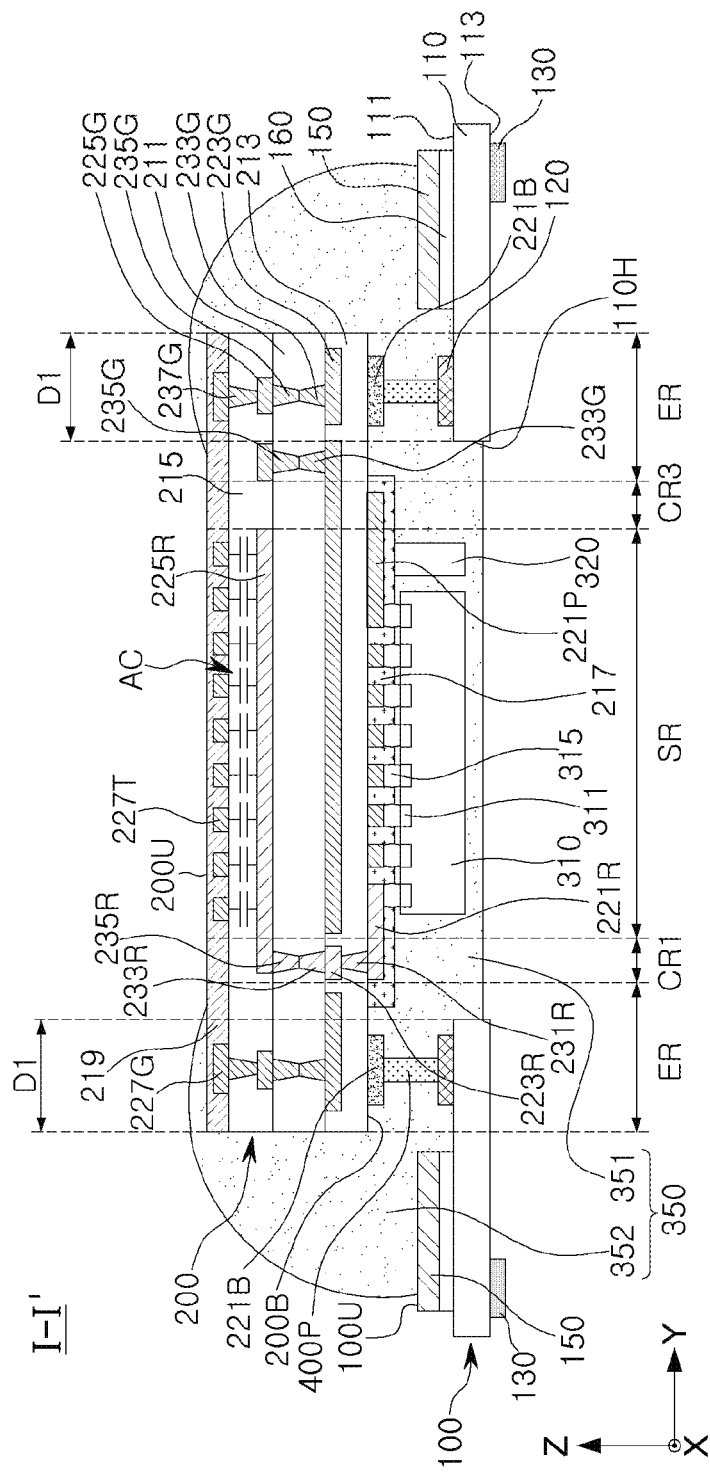
FIG. 6 is a cross-sectional view illustrating a fingerprint sensor package according to some example embodiments of the inventive concepts.

FIG. 6 illustrates a structure in which a fingerprint sensor package 10D according to some example embodiments includes a plurality of conductive posts 400P. Referring to FIGS. 1C and 6, the plurality of conductive posts 400P may be a structure that replaces the plurality of bumps 400 of FIG. 1C, and may support the substrate 200 and/or the film substrate 100, and may be used to adjust the separation distance between the substrate 200 and the film substrate 100. Like the plurality of bumps 400, the plurality of conductive posts 400P may also electrically connect the plurality of first bonding pads 120 and the plurality of second bonding pads 221B disposed to overlap in the vertical direction (for example, Z-direction). For example, the plurality of conductive posts 400P may be formed by forming a photoresist layer on the lower surface 200B of the substrate 200, forming holes in the photoresist layer, and filling the holes with a conductive material and etching the photoresist layer. For example, the plurality of conductive posts 400P and the plurality of first bonding pads 120 may be bonded by gold (Au) and tin (Sn) bonding, or gold (Au) and gold (Au) bonding.

Figure 7:
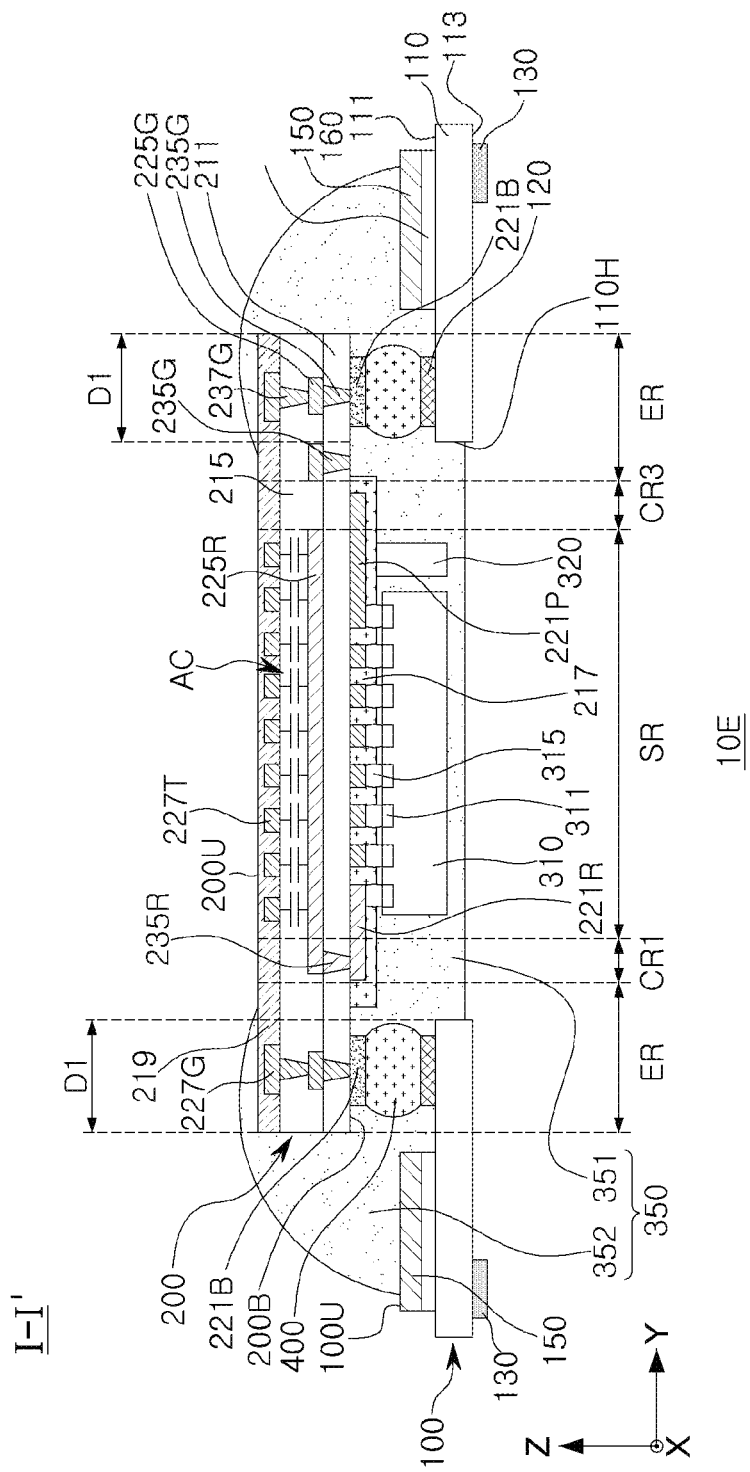
FIG. 7 is a cross-sectional view illustrating a fingerprint sensor package according to some example embodiments of the inventive concepts.

FIG. 7 illustrates that the structure of the substrate 200 of a fingerprint sensor package 10E according to some example embodiments is different from the structure of the substrate 200 in FIG. 1C. Referring to FIGS. 1C and 7, a substrate 200 of FIG. 7 may have a structure that does not include the lower insulating layer 213 and the second conductive layers 223G and 223R of FIG. 1C, and thus, the thickness of the substrate 200 in FIG. 7 may be thinner than the thickness of the substrate 200 in FIG. 1C. For example, the detailed structure of the substrate 200 of the fingerprint sensor packages 10 and 10E according to some example embodiments may vary depending on the design.

As set forth above, a fingerprint sensor package according to some example embodiments may be advantageous in reducing an overall size (a horizontal area and/or a vertical thickness) while improving durability and/or reliability.

For example, the fingerprint sensor package according to some example embodiments may use a structure electrically connecting a substrate and a film substrate without using wires, thereby improving electrical connection reliability.

For example, in the fingerprint sensor package according to some example embodiments, stress concentration on a controller chip due to flexibility of the film substrate may be reduced, thereby improving durability.

For example, the fingerprint sensor package according to some example embodiments may have an overall compressive structure, and a separate structure (for example, a separate PCB) to ensure the electrical connection reliability or durability. Therefore, the fingerprint sensor package may be advantageous to reduce the overall size (horizontal area and/or vertical thickness).

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, an application-specific integrated circuit (ASIC), etc.

While some example embodiments have been illustrated and described above, it will be apparent to those skilled in the art that modifications and variations could be made without departing from the scope of the inventive concepts as defined by the appended claims.

What is claimed is:

1. A fingerprint sensor package comprising:
a substrate including a plurality of first sensing patterns spaced apart from each other in a first direction and extending in a second direction intersecting the first direction, and a plurality of second sensing patterns spaced apart from each other in the second direction and extending in the first direction;
a film substrate defining a through-hole region penetrating the film substrate, the through-hole region overlapping a portion of the substrate in a vertical direction;
a controller chip in the through-hole region, the controller chip being electrically connected to the substrate;
a plurality of first bonding pads on an upper surface of the film substrate;
a plurality of second bonding pads on a lower surface of the substrate; and
a plurality of bumps electrically connected between the plurality of first bonding pads and the plurality of second bonding pads,
wherein the plurality of bumps are in direct contact with the plurality of first bonding pads and the plurality of second bonding pads, and
a melting point of the plurality of bumps is lower than a melting point of the plurality of first bonding pads and lower than a melting point of the plurality of second bonding pads.

2. The fingerprint sensor package of claim 1, wherein the plurality of bumps are arranged along an edge of the through-hole region, the plurality of bumps being spaced apart from each other.

3. The fingerprint sensor package of claim 1, further comprising a plurality of external connection pads electrically connected to the plurality of bumps, the plurality of external connection pads being on a lower surface of the film substrate.

4. The fingerprint sensor package of claim 1, wherein the substrate includes an upper insulating layer between the plurality of first sensing patterns and the plurality of second sensing patterns, and
the film substrate includes a film insulating layer having a flexibility greater than a flexibility of the upper insulating layer.

5. The fingerprint sensor package of claim 4, wherein the substrate further includes:
a base layer between the upper insulating layer and the controller chip;

a lower insulating layer between the base layer and the controller chip;
a ground pattern between the lower insulating layer and the base layer, the ground pattern vertically overlapping the controller chip; and
conductive vias spaced apart from the ground pattern, the conductive vias electrically connecting the plurality of first sensing patterns and the plurality of second sensing patterns to the controller chip.

6. The fingerprint sensor package of claim 1, further comprising a first encapsulant,
at least a portion of the first encapsulant being in the through-hole region, and the at least a portion of the first encapsulant sealing at least a portion of the controller chip.

7. The fingerprint sensor package of claim 6, wherein a portion of a lower surface of the controller chip is exposed without contacting the first encapsulant.

8. The fingerprint sensor package of claim 1, further comprising a first encapsulant surrounding the substrate, the first encapsulant being on the upper surface of the film substrate.

9. The fingerprint sensor package of claim 8, further comprising a second encapsulant,
at least a portion of the second encapsulant being in the through-hole region, and the at least a portion of the second encapsulant sealing at least a portion of the controller chip,
wherein the plurality of bumps are in direct contact with at least one of the first encapsulant and the second encapsulant.

10. The fingerprint sensor package of claim 1, wherein a height from a lower surface of the film substrate to the lower surface of the substrate is greater than a height from a lower surface of the controller chip to the lower surface of the substrate.

11. A fingerprint sensor package comprising:
a substrate including a plurality of first sensing patterns spaced apart from each other in a first direction and extending in a second direction intersecting the first direction, and a plurality of second sensing patterns spaced apart from each other in the second direction and extending in the first direction;
a film substrate defining a through-hole region penetrating the film substrate, the through-hole region overlapping a portion of the substrate in a vertical direction;
a controller chip in the through-hole region, the controller chip being electrically connected to the substrate; and
a plurality of external connection pads on a lower surface of the film substrate, wherein
a height from the lower surface of the film substrate to a lower surface of the substrate is greater than a height from a lower surface of the controller chip to the lower surface of the substrate,
the substrate includes an upper insulating layer between the plurality of first sensing patterns and the plurality of second sensing patterns, and
the film substrate includes a film insulating layer having a flexibility greater than a flexibility of the upper insulating layer.

12. The fingerprint sensor package of claim 11, wherein the substrate further includes:
a base layer between the upper insulating layer and the controller chip;
a lower insulating layer between the base layer and the controller chip;
a ground pattern between the lower insulating layer and the base layer, the ground pattern vertically overlapping the controller chip; and
conductive vias spaced apart from the ground pattern, the conductive vias electrically connecting the plurality of first sensing patterns and the plurality of second sensing patterns to the controller chip.

13. The fingerprint sensor package of claim 11, further comprising:
a plurality of first bonding pads on an upper surface of the film substrate; and
a plurality of second bonding pads on the lower surface of the substrate,
wherein the plurality of first bonding pads overlap the plurality of second bonding pads in the vertical direction, the plurality of first bonding pads being electrically connected to the plurality of second bonding pads.

14. The fingerprint sensor package of claim 11, further comprising an encapsulant,
a portion of the encapsulant being in the through-hole region, the portion of the encapsulant sealing at least a portion of the controller chip, and another portion of the encapsulant surrounding the substrate on an upper surface of the film substrate.

15. A device comprising:
a device body defining a recessed region in the device body;
a device substrate on the device body;
a device chip electrically connected to the device substrate;
a plurality of terminals in the recessed region, the plurality of terminals being electrically connected to the device substrate; and
a fingerprint sensor package in the recessed region, the fingerprint sensor package being electrically connected to the plurality of terminals,
wherein the fingerprint sensor package includes
a substrate including a plurality of first sensing patterns spaced apart from each other in a first direction and extending in a second direction intersecting the first direction, and a plurality of second sensing patterns spaced apart from each other in the second direction and extending in the first direction,
a film substrate defining a through-hole region penetrating the film substrate, the through-hole region overlapping a portion of the substrate in a vertical direction,
a controller chip in the through-hole region, the controller chip being electrically connected to the substrate,
a plurality of first bonding pads on an upper surface of the film substrate,
a plurality of second bonding pads on a lower surface of the substrate,
a plurality of bumps electrically connecting the substrate and the film substrate, and
an encapsulant,
a portion of the encapsulant being in the through-hole region, the portion of the encapsulant sealing at least a portion of the controller chip, and another portion of the encapsulant surrounding the substrate on the upper surface of the film substrate.

16. The device of claim 15, wherein the fingerprint sensor package further includes a plurality of external connection pads on a lower surface of the film substrate,
wherein the plurality of external connection pads are electrically connected to the plurality of terminals.

17. The device of claim 16, wherein a height from the lower surface of the film substrate to the lower surface of the substrate is greater than a height from a lower surface of the controller chip to the lower surface of the substrate.

18. The device of claim 17, wherein the lower surface of the substrate is within the recessed region.

* * * * *